(12) United States Patent
Sandhu et al.

(10) Patent No.: US 7,271,060 B2
(45) Date of Patent: Sep. 18, 2007

(54) SEMICONDUCTOR PROCESSING METHODS

(75) Inventors: Sukesh Sandhu, Boise, ID (US); Kelly T. Hurley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 77 days.

(21) Appl. No.: 11/166,490

(22) Filed: Jun. 24, 2005

(65) Prior Publication Data

US 2006/0292793 A1 Dec. 28, 2006

(51) Int. Cl.
*H01L 21/336* (2006.01)

(52) U.S. Cl. .................. 438/257; 438/424; 257/374

(58) Field of Classification Search .............. 438/257, 438/424, 427, 448, 735; 257/374, 774
See application file for complete search history.

(56) References Cited

U.S. PATENT DOCUMENTS

| | | | |
|---|---|---|---|
| 6,949,801 B2* | 9/2005 | Parat et al. | 257/374 |
| 6,995,095 B2* | 2/2006 | Yu | 438/750 |
| 2006/0270181 A1* | 11/2006 | Sandhu et al. | 438/424 |

\* cited by examiner

*Primary Examiner*—Phuc T. Dang
(74) *Attorney, Agent, or Firm*—Wells St. John P.S.

(57) ABSTRACT

The invention includes methods in which common processing steps are utilized during fabrication of components of a memory array region of a semiconductor substrate and components of a peripheral region proximate the memory array region, and yet the components of the peripheral region are built for different performance characteristics than the components of the memory array region. The methods can include laterally recessing nitride-containing masking structures associated with the peripheral region to a greater extent than nitride-containing masking structures associated with the memory array region, followed by thermal oxidation of the substrate to form dielectric material adjacent the masking structures.

25 Claims, 19 Drawing Sheets

SEMICONDUCTOR PROCESSING METHODS

TECHNICAL FIELD

The invention pertains to semiconductor processing methods.

BACKGROUND OF THE INVENTION

A memory chip (such as, for example, a dynamic random access memory, DRAM, chip) will typically have a memory array region and a peripheral region proximate the memory array region. The memory array region is an area where densely-packed memory structures are formed as an array of individually-accessible memory devices, and the peripheral region will typically comprise less densely-packed circuitry utilized for accessing the circuitry of the memory array region. For instance, the peripheral region can comprise logic circuitry, and frequently will comprise complementary metal oxide semiconductor (CMOS) structures. CMOS structures contain n-channel and p-channel metal oxide semiconductor (MOS) transistors, and are frequently utilized for implementation of digital functions.

It is desired to utilize common semiconductor processing steps for fabrication of structures associated with the peripheral region simultaneously with fabrication of structures associated with the memory array region in order to decrease the amount of time utilized in fabricating a semiconductor construction and thereby increase throughput of a semiconductor fabrication process. However, it is also desired to optimize memory devices and peripheral devices for the particular applications of the devices, which can make it difficult to utilize common processing steps to simultaneously fabricate memory devices and peripheral devices.

The present invention was motivated, at least in part, by a desire to develop a processing method which can optimize aspects of peripheral devices, and yet utilize some common processing steps for simultaneous fabrication of memory device structures and peripheral device structures. It is to be understood, however, that even though the invention was motivated by such desire, the invention is not limited to such applications except to the extent, if any, that the applications are expressly recited in the claims that follow.

SUMMARY OF THE INVENTION

In one aspect, the invention includes a semiconductor processing method. A semiconductor substrate is provided. The substrate has a memory array region and a peripheral region proximate the memory array region. Spaced nitride-containing masking structures are formed over the substrate. Some of the masking structures are first nitride-containing masking structures over the memory array region, and others are second nitride-containing masking structures over the peripheral region. Trenches are formed to extend into the substrate between the spaced nitride-containing masking structures. Some of the trenches are first trenches associated with the memory array region and other are second trenches associated with the peripheral region. The second trenches are formed to be substantially deeper than the first trenches. After the first and second trenches are formed, the second nitride-containing masking structures are laterally recessed to a degree greater than any lateral recessing of the first nitride-containing masking structures. After the lateral recessing of the second nitride-containing masking structures, the substrate is oxidized within the first and second trenches. The first and second trenches are subsequently filled with insulative material.

In one aspect, the invention encompasses another semiconductor processing method. A semiconductor substrate is provided. The substrate has a memory array region and a peripheral region proximate the memory array region. Spaced masking stacks are formed over the memory array region and the peripheral region. The masking stacks comprise a nitride-containing layer and an oxide-containing layer over the nitride-containing layer. Trenches are formed to extend into the substrate between the spaced masking stacks. Some of the trenches are first trenches associated with the memory array region, and others are second trenches associated with the peripheral region. The second trenches are extended deeper into the substrate while the first trenches are protected with a protective material provided within the first trenches. After the second trenches are extended, the nitride-containing layer of the masking stacks over the peripheral region is laterally recessed. The protective material is removed from within the first trenches. After laterally recessing the nitride-containing layer, the substrate is oxidized within the first and second trenches. The first and second trenches are then filled with insulative material.

In one aspect, the invention encompasses yet another semiconductor processing method. A semiconductor substrate is provided. The substrate has a memory array region and a peripheral region proximate the memory array region. A stack is formed over the peripheral and memory array regions of the substrate. The stack comprises, in ascending order, a nitride-containing layer, an oxide-containing layer, a carbon-containing layer, and an anti-reflective coating. Patterned photoresist is formed over the stack to form a patterned mask. A pattern is transferred from the photoresist mask to the oxide-containing layer and the nitride-containing layer to form spaced masking stacks comprising the patterned nitride-containing layer and patterned oxide-containing layer. The carbon-containing layer, anti-reflective coating and patterned photoresist mask are removed. Trenches are formed to extend into the substrate between the spaced masking stacks. Some of the trenches are first trenches associated with the memory array region and others are second trenches associated with the peripheral region. A protective material is formed over the memory array region. While the protective material is over the memory array region the second trenches are extended to be deeper within the substrate. The protective material is removed. After the second trenches are extended, the nitride-containing layer of the masking stacks over the peripheral region is laterally recessed. After the nitride-containing layer is laterally recessed, and after the protective material is removed, the substrate is oxidized within the first and second trenches. Subsequently, the first and second trenches are filled with insulative material.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Frequently, the amount of current passed through peripheral devices is much higher than that passed through memory array devices. Accordingly, it is desired to tailor the isolation between adjacent peripheral devices to accommodate the higher current, and also to tailor the devices themselves to accommodate the higher current. In some aspects, the present invention enables isolation and circuitry associated with a peripheral region of a semiconductor substrate to be tailored to accommodate higher current, and yet also enables a number of processing steps associated with fabrication of memory devices and memory device isolation to be simultaneously conducted with fabrication of peripheral devices and peripheral device isolation. Exemplary aspects of the invention are described with reference to FIGS. 1–19.

Figure 1:
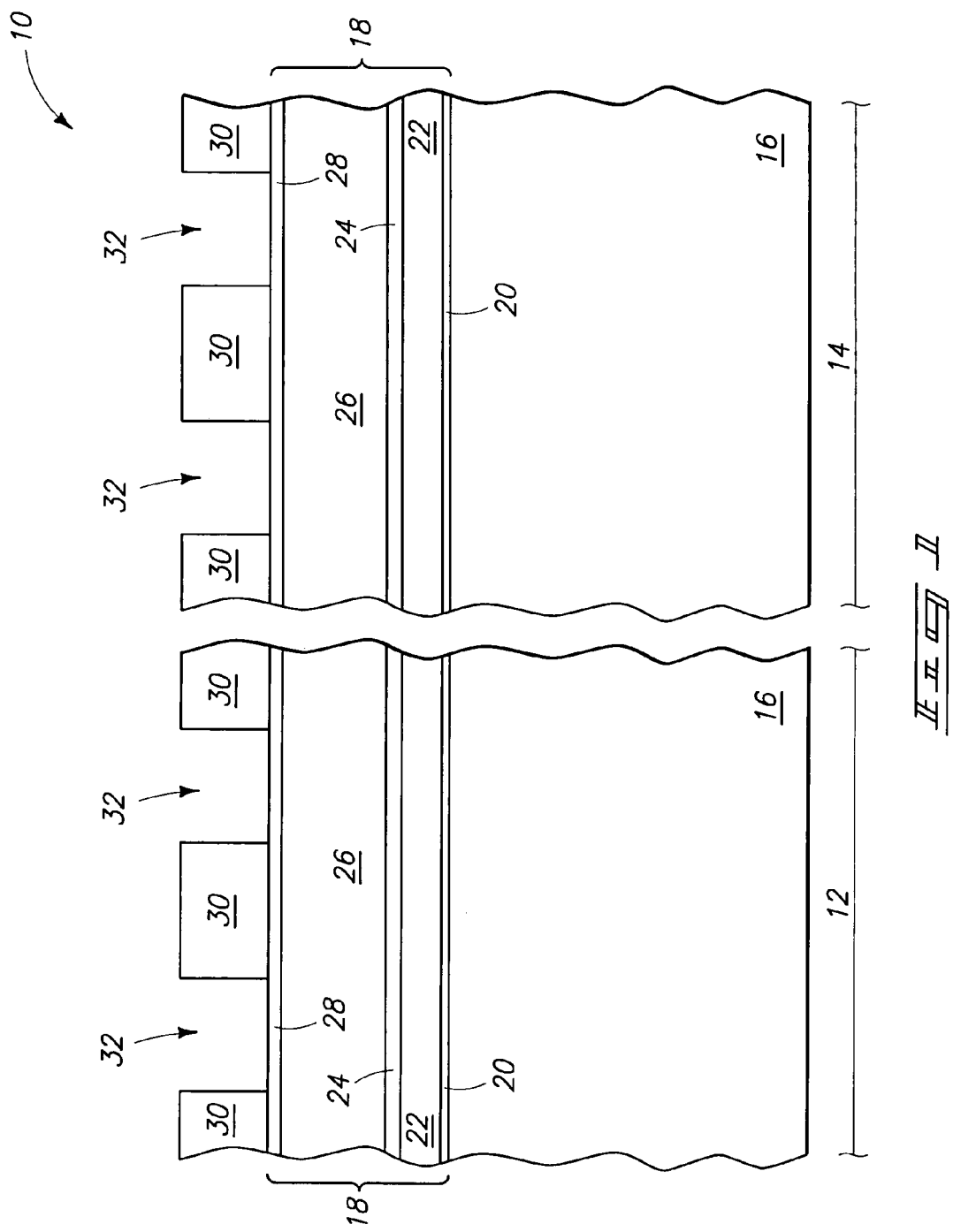
FIG. 1 is a diagrammatic, cross-sectional view of a pair of fragments of a semiconductor wafer at a preliminary processing stage of an exemplary aspect of the present invention.

Referring initially to FIG. 1, such shows a semiconductor construction 10 comprising a memory array region 12 and a peripheral region 14 proximate the memory array region.

The construction includes a substrate 16 which can, for example, comprise, consist essentially of, or consist of monocrystalline silicon lightly-doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In some aspects, the portion of the construction 10 associated with peripheral region 14 can be part of a CMOS construction. In such aspects, substrate 16 can be background-doped with either p-type dopant or n-type dopant, depending on whether the substrate is associated with the p-type MOS (PMOS) or n-type MOS (NMOS) of the CMOS construction.

A stack 18 is formed over the peripheral and memory array regions of the substrate 16. The stack 18 comprises, in ascending order from the substrate, a first oxide-containing layer 20, a nitride-containing layer 22, a second oxide-containing layer 24, a carbon-containing layer 26, and an anti-reflective coating 28.

The first oxide-containing layer 20 can, for example, comprise, consist essentially of, or consist of silicon dioxide. In some aspects, substrate 16 can consist essentially of, or consist of monocrystalline silicon or doped monocrystalline silicon. In such aspects, silicon dioxide of layer 20 can be provided to alleviate stress that would otherwise occur if nitride-containing layer 22 were placed directly on the monocrystalline silicon substrate 16.

Nitride-containing layer 22 can, for example, comprise, consist essentially of, or consist of silicon nitride.

Second oxide-containing layer 24 can, for example, comprise, consist essentially of, or consist of silicon dioxide. In some aspects, the oxide of layer 24 can be deposited from tetraethylorthosilicate (TEOS).

Carbon-containing layer 26 can, for example, comprise, consist essentially of, or consist of amorphous carbon.

Anti-reflective coating 28 can, for example, comprise, consist essentially of, or consist of a dielectric anti-reflective coating (DARC) such as, for example, a coating containing silicon, oxygen, and nitrogen.

A patterned photoresist mask 30 is formed over layer 28. The patterned mask can be formed by, for example, photolithographically patterning a layer of photoresist. The patterned mask has openings 32 extending therethrough.

Figure 2:
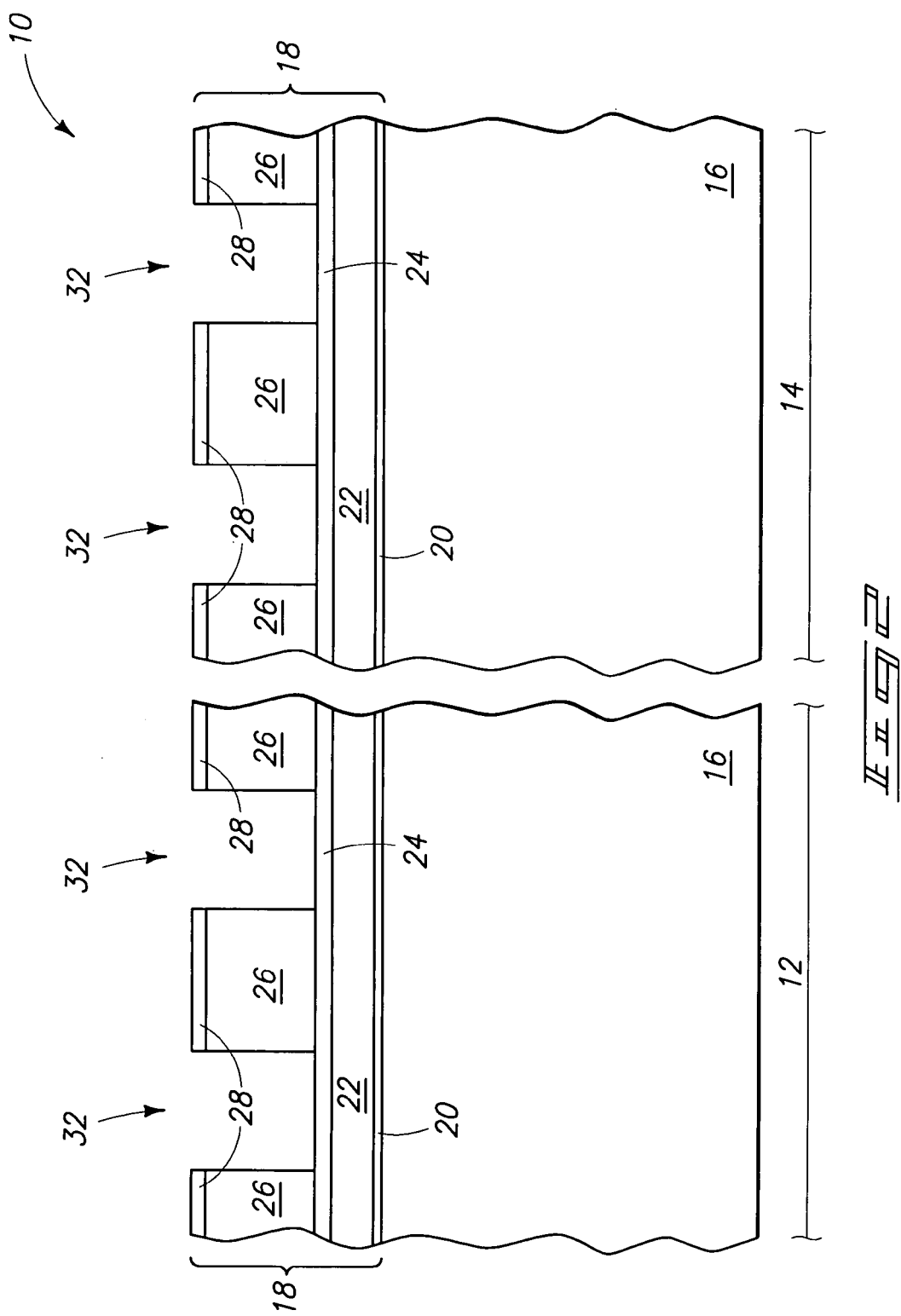
FIG. 2 is a view of the FIG. 1 fragments shown at a processing stage subsequent to that of FIG. 1.

Referring to FIG. 2, the openings 32 are extended through layers 26 and 28, and accordingly a pattern from the patterned photoresist mask 30 is transferred into the underlying layers 26, and 28. The patterning of layers 26 and 28 can be accomplished with any suitable etch, or combination of etches. In particular aspects, the etch can include a dry develop etch (carbon etch) which removes photoresist (30 of FIG. 1), and stops on oxide layer 24.

Figure 3:
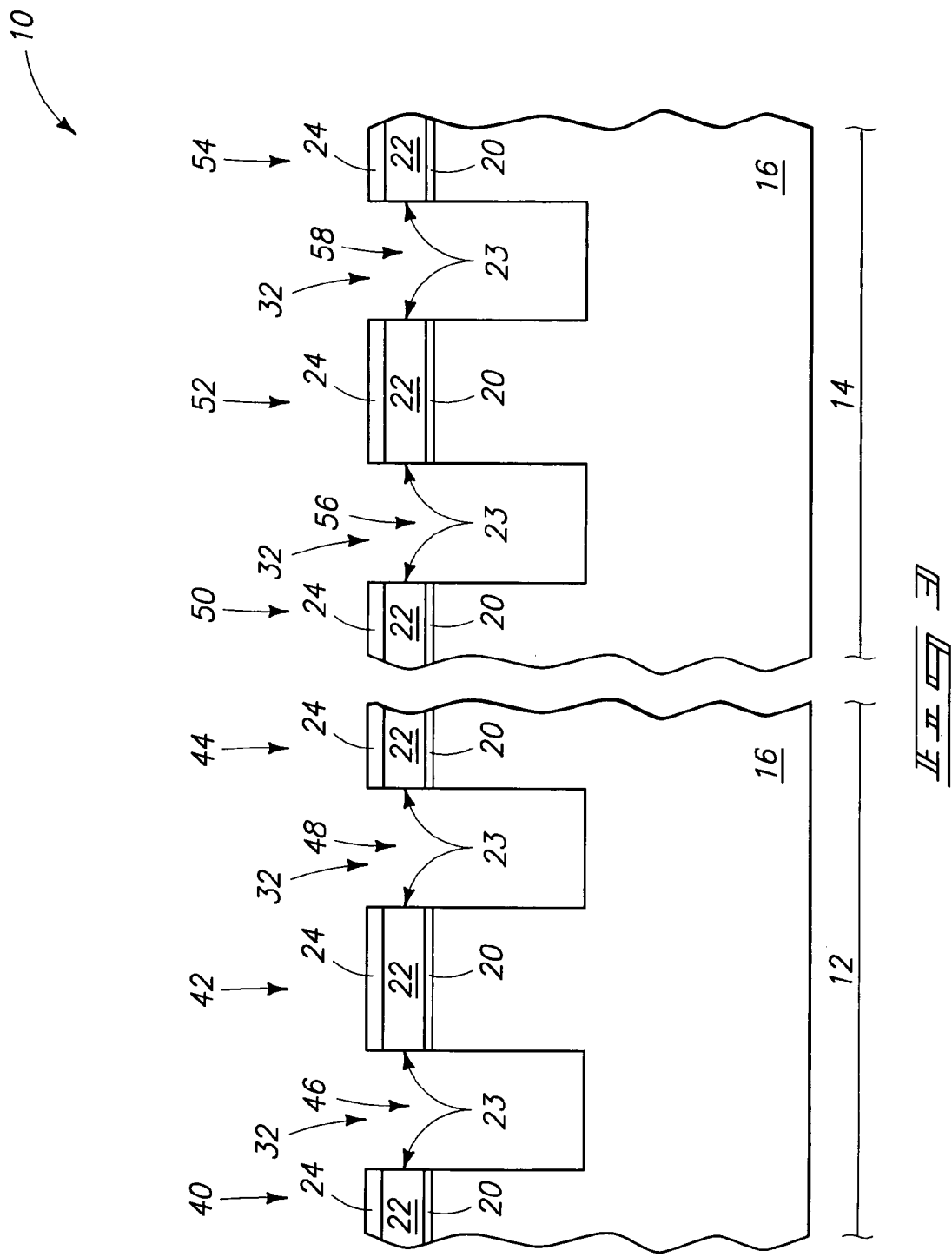
FIG. 3 is a view of the FIG. 1 fragments shown at a processing stage subsequent to that of FIG. 2.

Referring to FIG. 3, openings 32 are extended through layers 20, 22 and 24, and into the underlying substrate 16; and layers 26 and 28 (FIG. 2) are removed. The extension of the openings can be considered transferring of a pattern into materials 20, 22 and 24 to form a hard mask; and transferring of the pattern from the hard mask into the substrate 16. The carbon of layer 26 can be removed during the etching into substrate 16, as well as with either a wet piranha etch or a dry strip type of etch.

The construction of FIG. 3 comprises a plurality of spaced masking stacks 40, 42, 44, 50, 52 and 54 containing patterned layers 20, 22 and 24. The masking stacks can be considered to comprise a plurality of first masking stacks 40, 42 and 44 associated with the memory array region 12, and a plurality of second masking stacks 50, 52 and 54 associated with the peripheral region 14. In some aspects, the masking stacks can be referred to as nitride-containing masking structures since the stacks comprise the nitride-containing layer 22. The nitride-containing masking structures have sidewall edges 23 exposed within the openings.

The openings 32 of FIG. 3 correspond to trenches 46, 48, 56 and 58 extending into the substrate 16. The trenches 46 and 48 associated with the memory array region can be referred to as first trenches, and the trenches 56 and 58 associated with the peripheral region can be referred to as second trenches.

The extension of openings 32 through layers 20 and 22 and into substrate 16 can be accomplished with one or more appropriate etches. In some aspects, the spaced masking structures 40, 42, 44, 50, 52 and 54 will first be formed, and subsequently the trenches 46, 48, 56 and 58 will be extended into substrate 16 with different etching conditions than those utilized to form the spaced masking structures. In any event, the masking structures formed across the peripheral region 14 can be formed with common processing as the masking structures formed across the memory array region 12, and accordingly can be formed simultaneously with the masking structures formed across the memory array region 12. Also, the trenches formed across the peripheral region can be formed with common processing as the trenches formed across the memory array region, and accordingly can be formed simultaneously with the trenches formed across the memory array region.

The trenches 46 and 48 associated with the memory array region 12 have approximately a common depth as the trenches 56 and 58 associated with the peripheral region 14 at the processing stage of FIG. 3.

Figure 4:
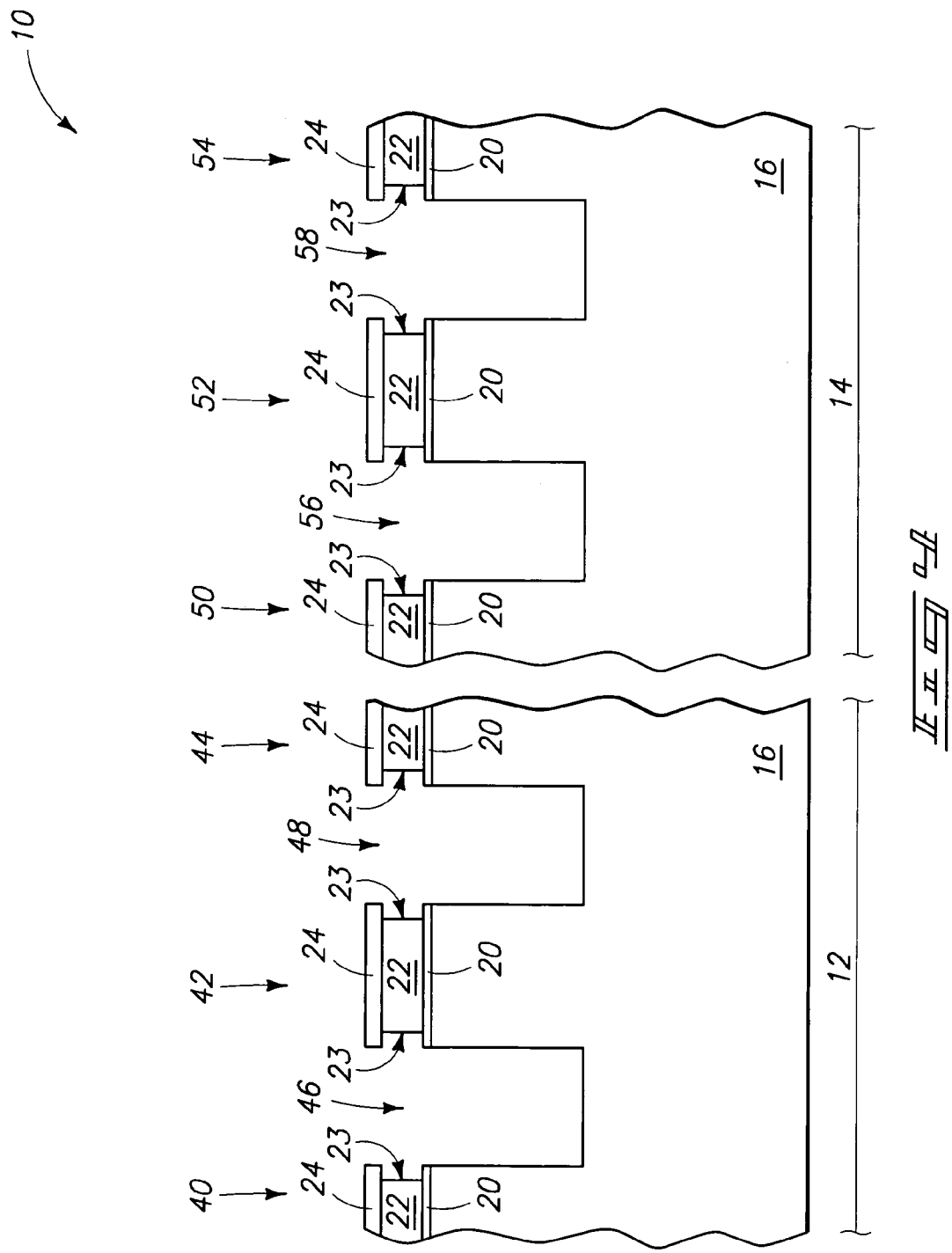
FIG. 4 is a view of the FIG. 1 fragments shown at a processing stage subsequent to that of FIG. 3.

Referring next to FIG. 4, the nitride-containing layer 22 of masking stacks 40, 42, 44, 50, 52 and 54 is exposed to an etch which laterally recesses the sidewall edges 23 of the layer. The lateral recessing of the sidewall edges can be accomplished with any suitable etch, including, for example, a wet nitride strip utilizing hot phosphoric acid for a time of from about 90 seconds to about 480 seconds (with the hot phosphoric acid stripping the nitride at a rate of about 44 Å per minute). In some aspects, the wet nitride strip removes from about 60 Å to about 350 Å of the exposed nitride-containing material of layer 22.

After the etching of layer 22, construction 10 can be subjected to an appropriate clean to remove any native oxide that has formed within trenches 46, 48, 56 and 58. The clean can utilize, for example, hydrofluoric acid.

Figure 5:
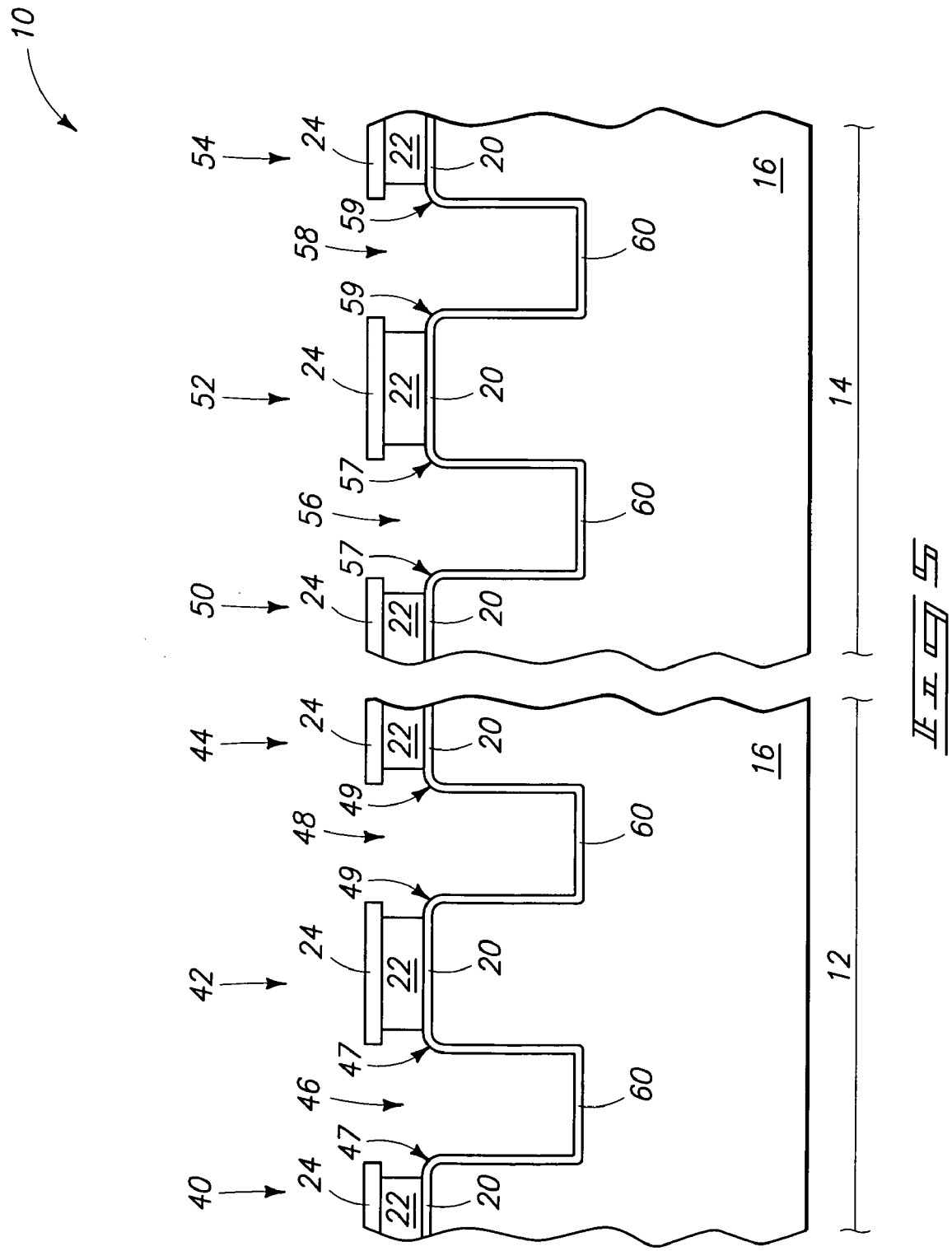
FIG. 5 is a view of the FIG. 1 fragments shown at a processing stage subsequent to that of FIG. 4.

Referring next to FIG. 5, an oxide layer is formed within trenches 46, 48, 56 and 58 from exposed surfaces of silicon-containing substrate 16. Oxide layer 60 can comprise, consist essentially of, or consist of silicon dioxide, and can be formed by dry thermal oxidation of exposed surfaces of a monocrystalline silicon substrate 16. The oxide layer 60 is shown merging with oxide-containing layer 20 since, in particular aspects of the invention, the material of oxide layer 60 and the material of oxide layer 20 can be identical in composition to one another. The oxide layer 60 can be formed to an exemplary thickness of from about 35 Å to about 150 Å.

The trenches 46, 48, 56 and 58 within the substrate 16 have uppermost corners 47, 49, 57 and 59, respectively. The oxidation of substrate 16 within the trenches 46, 48, 56 and 58 rounds such uppermost corners. Specifically, the uppermost corners have been exposed to the oxidation conditions due to the lateral recessing of nitride-containing layer 22. The rounding of the uppermost corners can be advantageous for performance of devices ultimately formed over substrate 16, as will be discussed in more detail below.

Although dry thermal oxidation is discussed with reference to FIG. 5 as a process for forming oxide-containing layer 60, it is to be understood that other oxidation conditions can also be utilized. For instance, wet thermal oxidation (such as, for example, in situ steam generation, ISSG) can be utilized. Wet thermal oxidation is discussed in more detail with reference to FIGS. 14–19 below.

Referring again to FIG. 5, the projections of substrate 16 between trenches 46, 48, 56, 58 can be referred to as mesas. Accordingly, the masking materials 22 and 24 can be considered to be supported by mesas extending between spaced trenches, and the oxidation utilized to form oxide-containing material 60 can be considered to round uppermost corners of such mesas.

Figure 6:
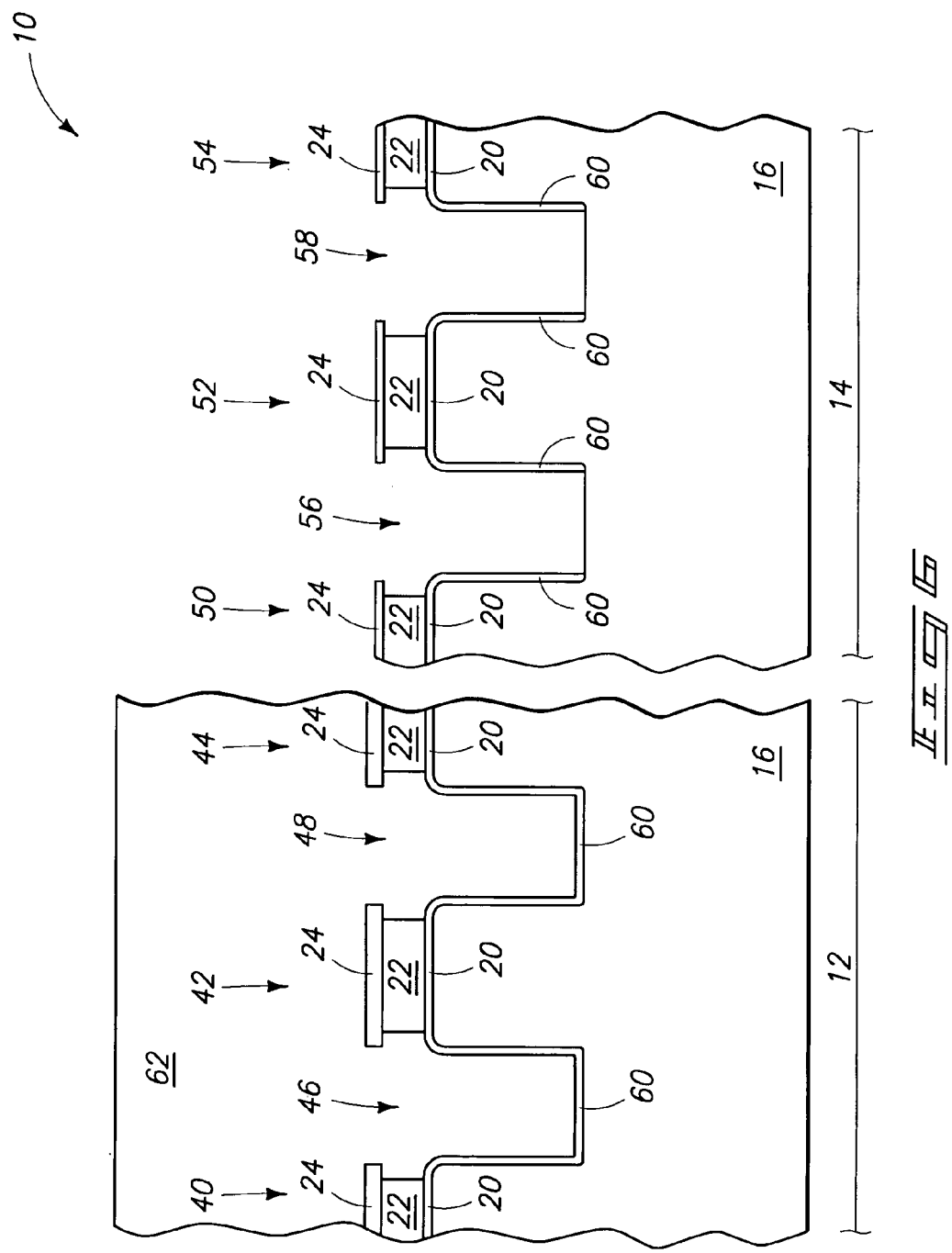
FIG. 6 is a view of the FIG. 1 fragments shown at a processing stage subsequent to that of FIG. 5.

Referring to FIG. 6, a protective material 62 is formed over memory array region 12 and within the trenches 46 and 48. While the protective material 62 protects structures associated with the memory array region 12, the peripheral region 14 is exposed to an oxide etch which removes oxide layer 60 from the bottoms of trenches 56 and 58. The oxide etch can also reduce a thickness of oxide-containing material 24 associated with masking structures 50, 52 and 54, as shown. The oxide etch will typically be a dry oxide etch so that the etch can be anisotropically utilized to remove oxide 60 from the bottoms of trenches 56 and 58 while leaving the oxide along the sidewalls of the trenches.

The protective material 62 can comprise any suitable material, and in some aspects will comprise, consist essentially of, or consist of photoresist. The material 62 can be considered to be patterned with a non-critical mask, in that the material can be provided to blanket cover the memory region 12 while not covering peripheral region 14. If protective material 62 comprises photoresist, such can be patterned utilizing photolithographic processing.

Figure 7:
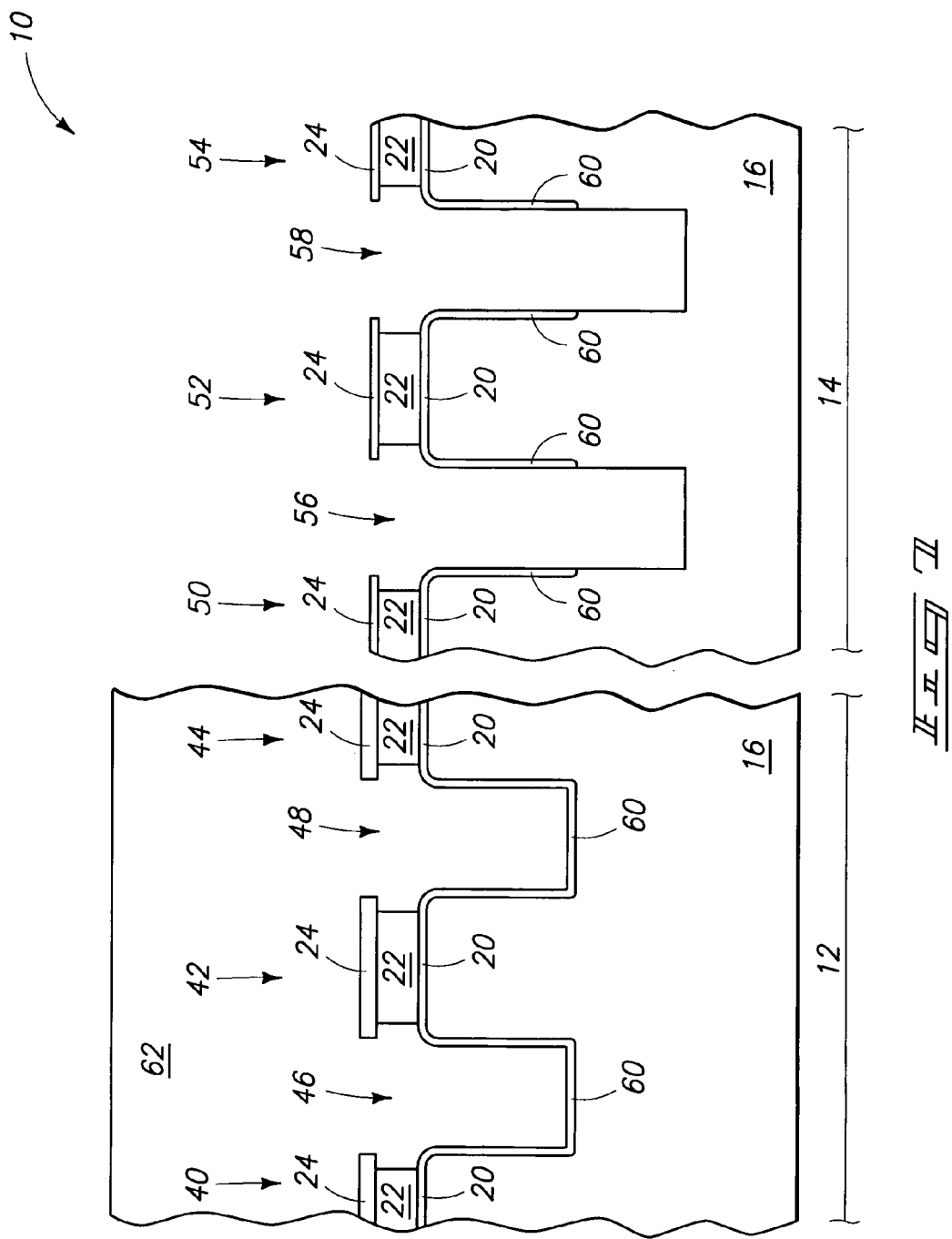
FIG. 7 is a view of the FIG. 1 fragments shown at a processing stage subsequent to that of FIG. 6.

Referring next to FIG. 7, material 62 and oxide 60 function as a protective mask during an etch into substrate 16 of peripheral region 14 which extends trenches 56 and 58 deeper into the substrate. The etch utilized to extend trenches 56 and 58 can be any suitable etch, but preferably is an etch selective for the material of substrate 16 relative to oxide layer 60. The trenches 56 and 58 are extended to be substantially deeper than the trenches 46 and 48. For instance, the trenches 46 and 48 can be provided to a depth of from about 2,000 Å to about 3,000 Å; and the extended trenches 56 and 58 can have a depth of from about 3,500 Å to about 5,000 Å.

Figure 8:
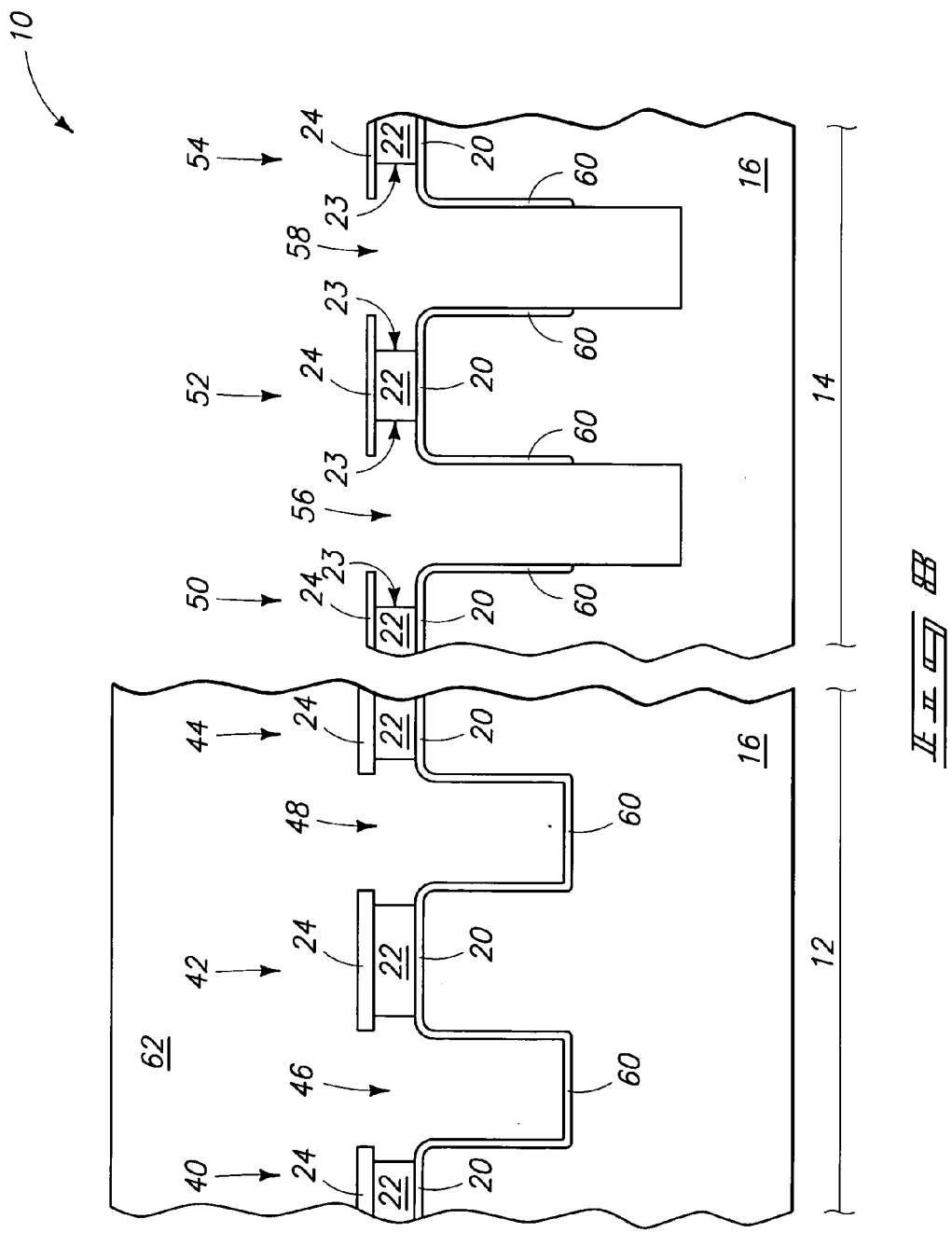
FIG. 8 is a view of the FIG. 1 fragments shown at a processing stage subsequent to that of FIG. 7.

Referring next to FIG. 8, the nitride-containing masking structures 22 associated with the peripheral region 14 (i.e., the second nitride-containing masking structures) are laterally recessed. More specifically, the nitride-containing structures 22 are exposed to an etch to remove some of the exposed nitride-containing material. The etch can be a dry nitride strip using $H_2$, $N_2$, $CF_4$ and $O_2$. For instance, the strip can use a flow of the following: $N_2$ with 3.8% $H_2$ at 700 standard cubic centimeters per minute (sccm) to 1600 sccm; $CF_4$ at 30 sccm to 200 sccm; $O_2$ at 40 sccm to 1000 sccm. A pressure during such etch can be from about 0.5 torr to about 2.5 torr; a temperature can be from about 20° C. to about 120° C.; and a microwave power can be from about 500 watts to about 3000 watts. Other gases could be used in addition to, or alternatively to, one or more of the $H_2$, $N_2$, $CF_4$ and $O_2$. Such other gases could comprise, for example, $N_2O$ and $H_2$; $H_2O$ and $N_2$; $CHF_3$; and $NF_3$. It is noted that the lateral recessing of the nitride-containing masking structures can be accomplished in a common processing step with the extension of the trenches into the peripheral region silicon (the processing discussed above with reference to FIG. 7) in some aspects of the invention.

The strip utilized to laterally recess the structures 22 can be conducted for an appropriate period of time to remove from about 50 Å to about 200 Å of the material of such structures. The lateral recessing of material 22 at the processing stage of FIG. 8 can be referred to as a second lateral recessing of the material 22 to distinguish such lateral recessing from the first lateral recessing of the material that occurred at the processing stage of FIG. 4.

The protective material 62 protects nitride-containing structures 22 of first masking stacks 40, 42 and 44 from exposure to the etch utilized to laterally recess the structures associated with peripheral region 14. Accordingly, the nitride-containing masking structures 22 associated with peripheral region 14 are laterally recessed, while the nitride-containing masking structures associated with memory array region 12 are not laterally recessed at the processing stage of FIG. 8.

Figure 9:
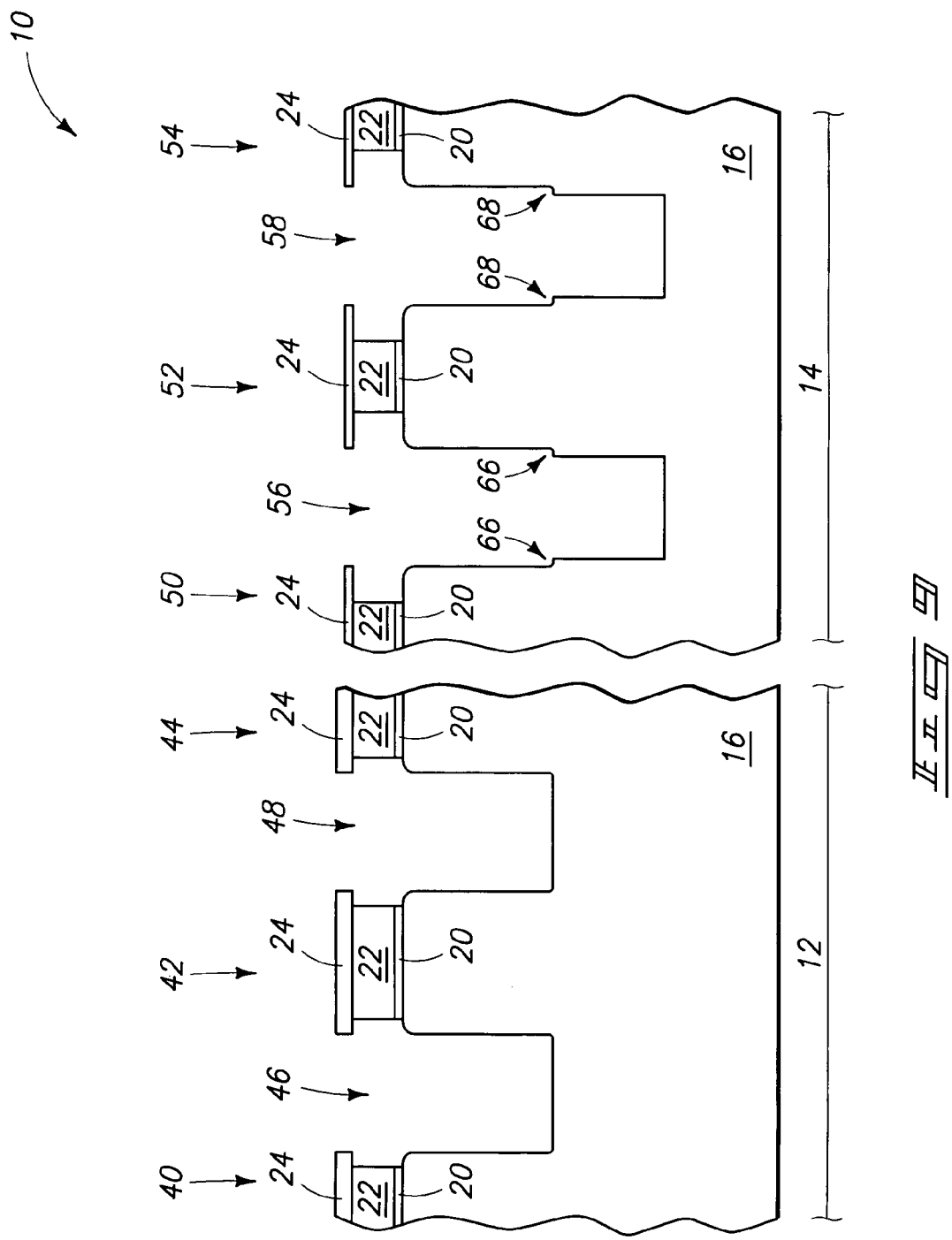
FIG. 9 is a view of the FIG. 1 fragments shown at a processing stage subsequent to that of FIG. 8.

Referring next to FIG. 9, protective material 62 (FIG. 8) is removed, and subsequently an oxide etch is utilized to remove oxide 60 (FIG. 8). The etch utilized to remove the oxide can be any suitable etch, and in some aspects can utilize hydrofluoric acid. The nitride-containing structures 22 protect the oxide 20 underlying such structures, although there may be some undercutting of the structures 22 (not shown) during the exposure of construction 10 to the oxide-etching conditions.

The trenches 56 and 58 are shown to comprise small steps 66 and 68, respectively, as remnants of a region from where oxide material 60 (FIG. 8) has been removed. Typically, the steps would be very small (on the order of 100 Å or less), since the steps would correspond to about the thickness of the oxide-containing layer 60.

Figure 10:
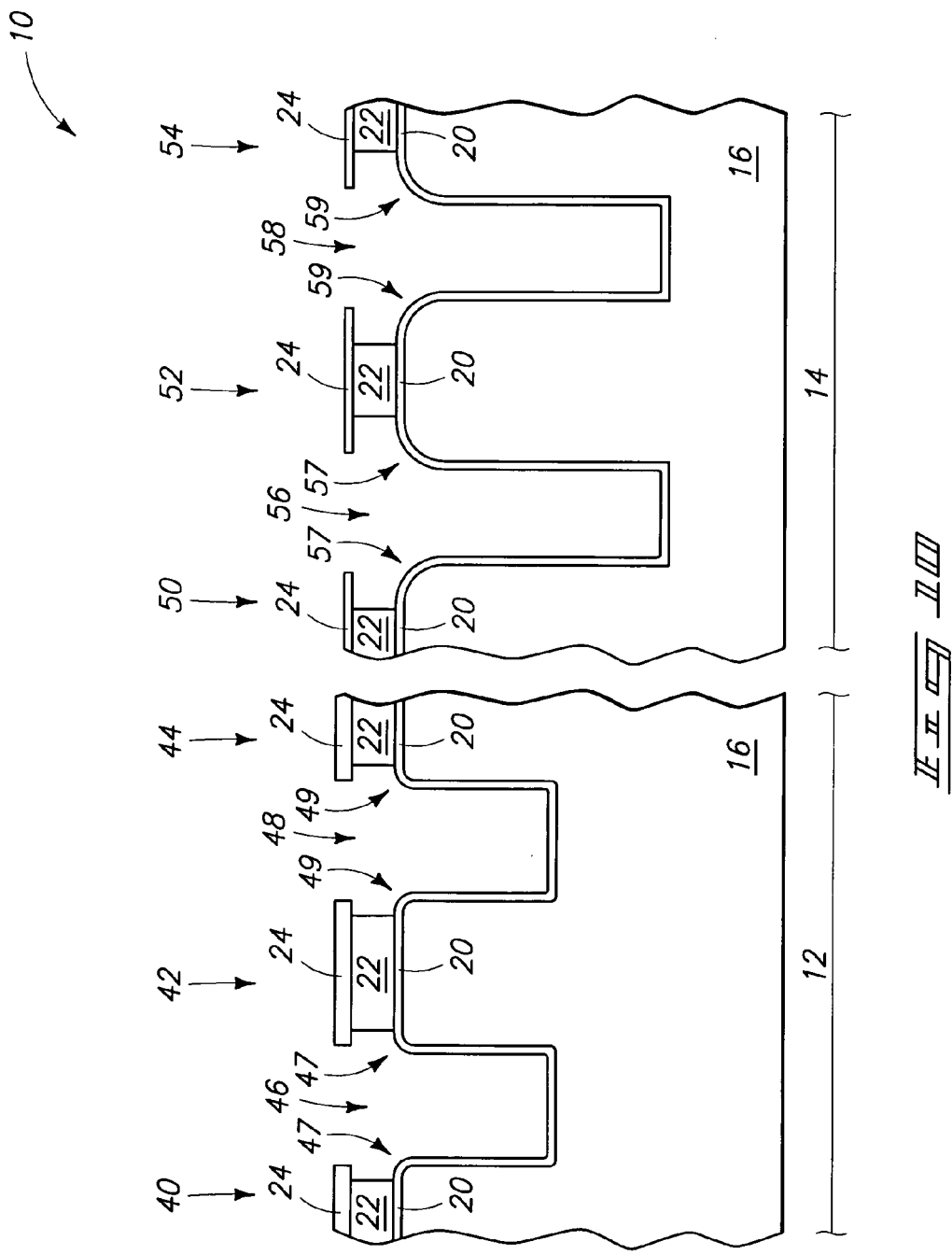
FIG. 10 is a view of the FIG. 1 fragments shown at a processing stage subsequent to that of FIG. 9.

Referring to FIG. 10, construction 10 is exposed to oxidizing conditions which form an oxide layer 70 across exposed surfaces of substrate 16 within trenches 46, 48, 56 and 58. The oxidizing conditions can comprise thermal oxidation of exposed surfaces of a monocrystalline silicon substrate 16 to form layer 70 to comprise, consist essentially of, or consist of silicon dioxide. The oxidation that forms oxide 70 can be referred to as a second oxidation to distinguish such oxidation from the first oxidation which formed oxide layer 60 (FIG. 5).

Oxide layer 70 is shown merging with the oxide-containing material 20, since the layer 70 and material 20 can comprise identical compositions in some aspects of the invention.

The oxidation of substrate 16 causes additional rounding at the uppermost corners 57 and 59 of trenches 56 and 58 due to the additional lateral recessing of nitride-containing structures 22 of masking stacks 50, 52 and 54. Specifically, the lateral recessing of the nitride-containing structures 22 of stacks 50, 52 and 54 at the processing stage of FIG. 8 exposes additional regions of corners 57 and 59 to the oxidation conditions utilized to form oxide 70, and such causes additional rounding of corners 57 and 59.

Since the nitride-containing structures 22 of the masking stacks associated with the memory array region (stacks 40, 42 and 44) were not subjected to the lateral recessing of FIG. 8, the corners 47 and 49 of trenches 46 and 48 do not undergo the substantial rounding that occurs relative to corners 57 and 59 of trenches 56 and 58 during the oxidation of substrate 16. Thus, even though common processing is utilized to form oxide layer 70 within trenches associated with memory array region 12 and trenches associated with peripheral region 14, additional rounding is induced at uppermost corners of the trenches associated with the peripheral region 14 that is not induced at uppermost corners of the trenches associated with memory array region 12.

As discussed above, the projections of substrate 16 between trenches 46, 48, 56 and 58 can be referred to as mesas in some aspects of the invention. Accordingly, the rounding of uppermost corners 57 and 59 can be described as rounding of uppermost corners of mesas in some aspects of the invention.

Figure 11:
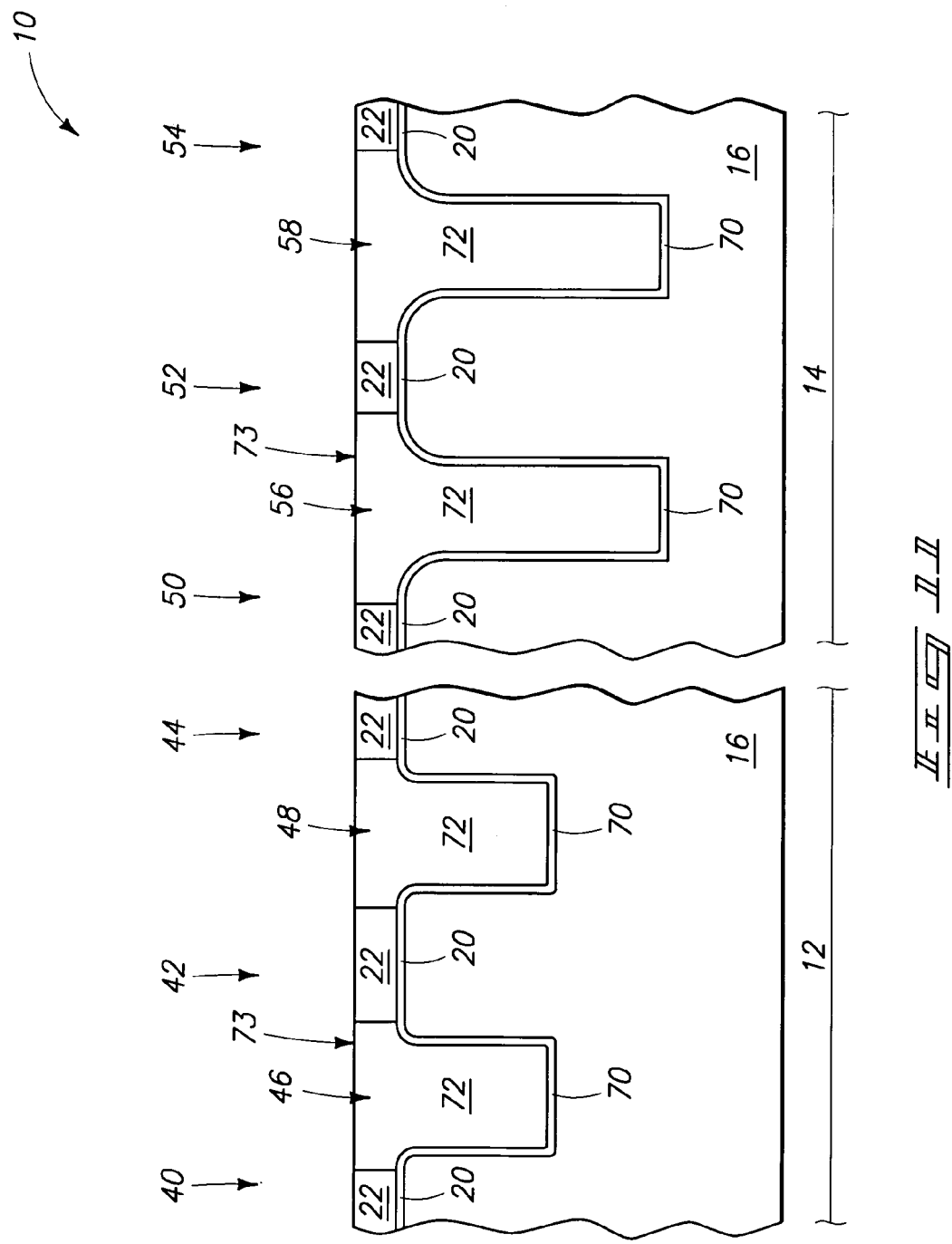
FIG. 11 is a view of the FIG. 1 fragments shown at a processing stage subsequent to that of FIG. 10.

Referring to FIG. 11, oxide-containing layer 24 is removed and trenches 46, 48, 56 and 58 are filled with insulative material 72. The insulative material can, for example, comprise, consist essentially of, or consist of silicon dioxide. If the material 72 is silicon dioxide, such material can have an identical composition as layer 70 and material 20, and accordingly all of the materials 20, 70 and 72 can merge into a single insulative material. Material 72 is shown as a distinct composition from materials 70 and 20 in the diagram of FIG. 11 in order to simplify the discussion that material 72 is formed in a separate processing step from materials 70 and 20, and not to imply that material 72 would differ in composition from materials 70 and 20 in typical aspects of the invention. Layer 24 (FIG. 10) can be removed before or after formation of insulative material 72 within trenches 46, 48, 56 and 58.

FIG. 11 shows a planarized upper surface 73 extending across materials 72 and 22. Such planarized upper surface can be formed by, for example, chemical-mechanical planarization utilizing nitride-containing material 22 as an etch stop. Accordingly, regardless of whether layer 24 (FIG. 10) is present after formation of material 72, such layer can be removed by the planarization utilized to form the planarized upper surface 73.

Figure 12:
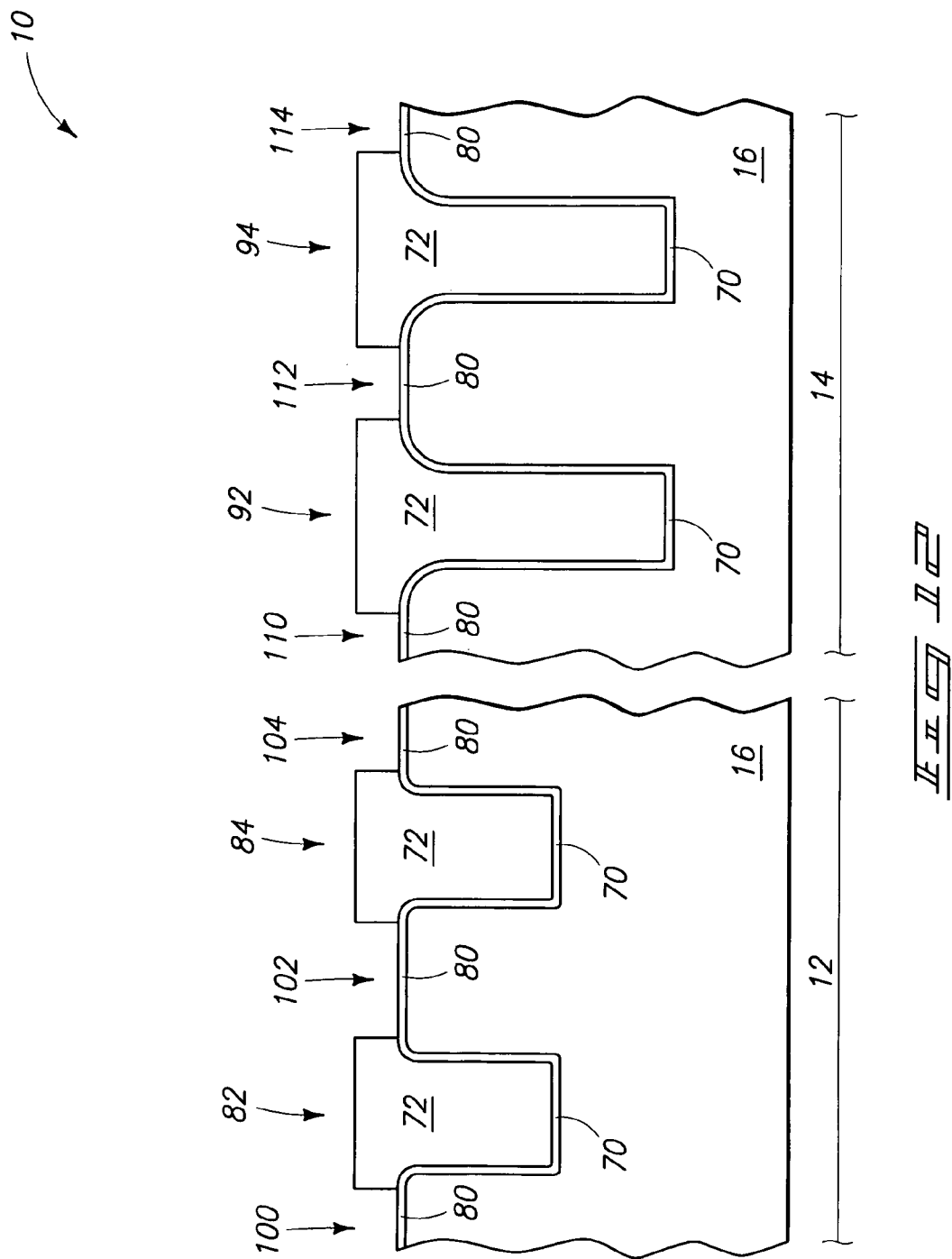
FIG. 12 is a view of the FIG. 1 fragments shown at a processing stage subsequent to that of FIG. 11.

Referring to FIG. 12, stacks 40, 42, 44, 50, 52 and 54 of materials 22 and 20 are removed, and subsequently a fresh dielectric material 80 is provided to replace the material 20. Material 80 can, for example, comprise, consist essentially of, or consist of silicon dioxide. The material 80 can be formed by either thermal oxidation of exposed surfaces of substrate 16, or by deposition.

It can be advantageous to remove material 20, in that such may have defects or contaminants introduced therein by the processing described previously. However, it is to be understood that the invention also encompasses aspects in which it is only nitride-containing material 22 that is removed, and material 20 remains at the processing stage of FIG. 12. In such aspects, material 80 can be omitted and it can be material 20 that remains as the dielectric material at uppermost surfaces of substrate 16.

The construction of FIG. 12 can be considered to comprise trenched isolation regions 82 and 84 associated with memory array region 12, and trenched isolation regions 92 and 94 associated with peripheral region 14. The construction can further be considered to comprise mesas 100, 102 and 104 extending upwardly beside the isolation regions 82 and 84 of memory array region 12; and mesas 110, 112 and 114 extending upwardly beside the isolation regions 92 and 94 of peripheral region 14. The mesas 110, 112 and 114 have more severely rounded uppermost corners than the mesas 100, 102 and 104.

Figure 13:
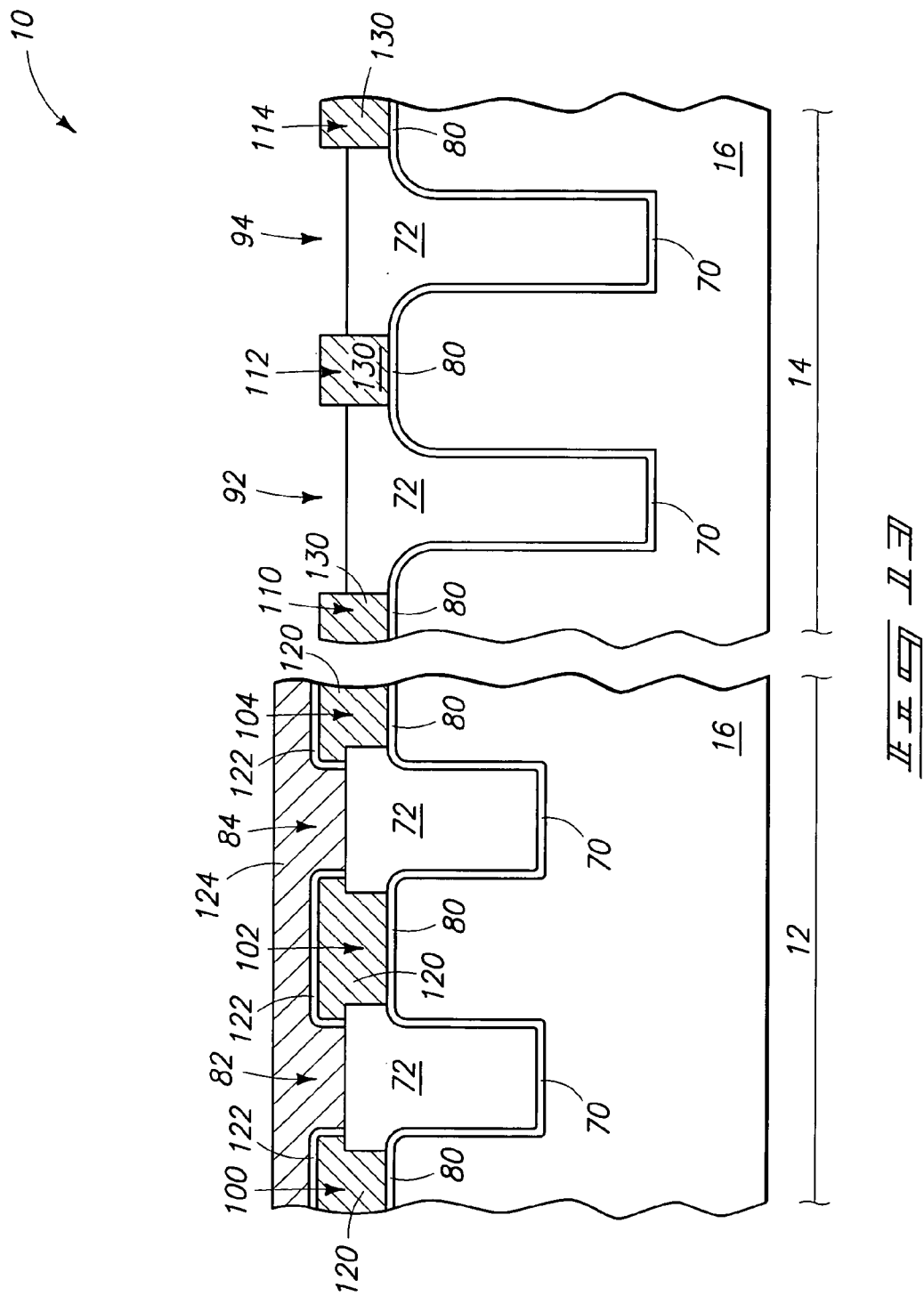
FIG. 13 is a view of the FIG. 1 fragments shown at a processing stage subsequent to that of FIG. 12.

Referring next to FIG. 13, conductive material 120 is formed over mesas 100, 102 and 104; and similarly conductive material 130 is formed over mesas 110, 112 and 114. The conductive material 120 can be incorporated into wordlines, and accordingly can have regions corresponding to transistor gates. Such transistor gates can then be part of a memory array, such as, for example, a dynamic access memory array.

In the shown aspect of the invention, the conductive material 120 has a dielectric material 122 formed thereover, and has another conductive material 124 formed over the dielectric material. The construction comprising conductive materials 120 and 124, and dielectric material 122, can be a portion of a flash memory array.

The conductive materials 120 and 124 can comprise any suitable conductive materials, and in particular aspects can comprise, consist essentially of, or consist of one or more of various metals, metal compositions, and conductively-doped semiconductor materials (such as, for example, conductively-doped silicon). The dielectric material 122 can comprise any suitable composition or combination of compositions, and in particular aspects will comprise one or both of silicon dioxide and silicon nitride. Although not shown, source/drain regions and channel regions can be formed within the mesas 100, 102 and 104 as part of transistor structures formed across memory array region 12.

The conductive material 130 formed across peripheral region 14 can comprise any suitable composition or combination of compositions, and in particular aspects will comprise, consist essentially of, or consist of one or more of various metals, metal compositions, and conductively-doped semiconductor material (such as, for example, conductively-doped silicon). The conductive material 130 can extend in and out of the plane of the cross-sectional view of FIG. 13 to form spaced lines extending across peripheral region 14.

An advantage of the methodology of the present invention is that the isolation regions and mesas of the memory array region 12 and peripheral region 14 have been tailored for the particular devices that are to be formed over the memory array region and peripheral region. Specifically, the isolation regions 92 and 94 of the peripheral region 14 are formed to be deeper than the isolation regions 82 and 84 of the memory array region, which can aid in utilizing devices associated with the peripheral region that have more current passing therethrough than the devices associated with the memory array region. Further, the mesas 110, 112 and 114 have more severely rounded corners than the mesas 100, 102 and 104, which can also aid in electrically isolating devices having high current flow that are associated with the peripheral region. The more shallow isolation regions associated with memory array region 12, and mesas having less rounded upper corners associated with the memory array region, can allow tighter packing of devices in the memory array region than can be achieved in the peripheral region. Accordingly, the constructions associated with the memory array region are tailored for tight packing, and the constructions associated with the peripheral region are tailored for high current flow.

FIGS. 1–13 describe an exemplary process in which dry oxidation is utilized to form the initial oxide layer within the trenches (specifically, the oxide layer 60 formed at the processing stage of FIG. 5). As indicated above, the invention also encompasses aspects in which wet oxidation is utilized to form such oxide layer. An exemplary aspect of the invention utilizing wet oxidation is described with reference to FIGS. 14–19. In referring to FIGS. 14–19, similar numbering will be used as was utilized above in describing FIGS. 1–13, where appropriate.

Figure 14:
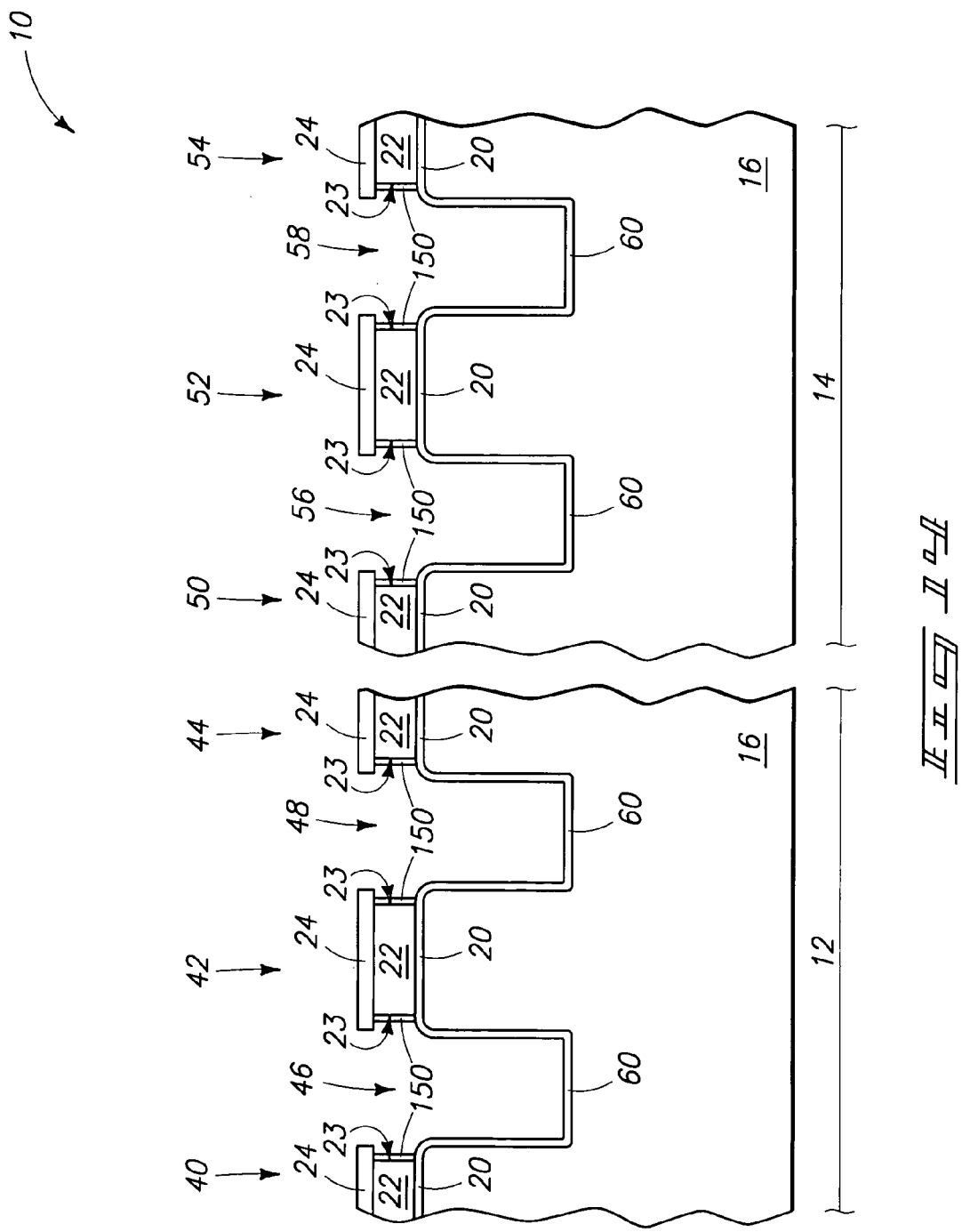
FIG. 14 is a view of the FIG. 1 fragments shown at a processing stage subsequent to that of FIG. 4 in accordance with an aspect of the invention alternative to that of FIG. 5.

Referring to FIG. 14, construction 10 is illustrated at a processing stage subsequent to that of FIG. 4, and alternative to that of FIG. 5. The construction comprises the oxide layer 60 described previously. However, in contrast to the aspect of the invention described with reference to FIG. 5, the aspect of FIG. 14 has oxide layer 60 formed by wet oxidation (such as, for example, ISSG). Such wet oxidation also forms an oxide 150 along the sidewall edges 23 of nitride-containing material 22.

The oxide 150 can, for example, comprise, consist essentially of, or consist of silicon oxynitride. Accordingly, in contrast to the aspect of the invention described with reference to FIG. 5 which did not appreciably oxidize exposed nitride-containing lateral surfaces 23, the wet oxidation of FIG. 14 does oxidize such nitride-containing lateral surfaces. The oxide layers 60 and 150 can together be referred to as a first oxide formed by exposing construction 10 to oxidizing conditions, with it being understood that such first oxide actually comprises two different compositions. One of the compositions is an oxide of substrate 16 (such as, for example, silicon dioxide when substrate 16 consists of monocrystalline silicon), and the other composition is an oxide of nitride-containing material 22 (such as, for example, silicon oxynitride when material 22 consists of silicon nitride).

Figure 15:
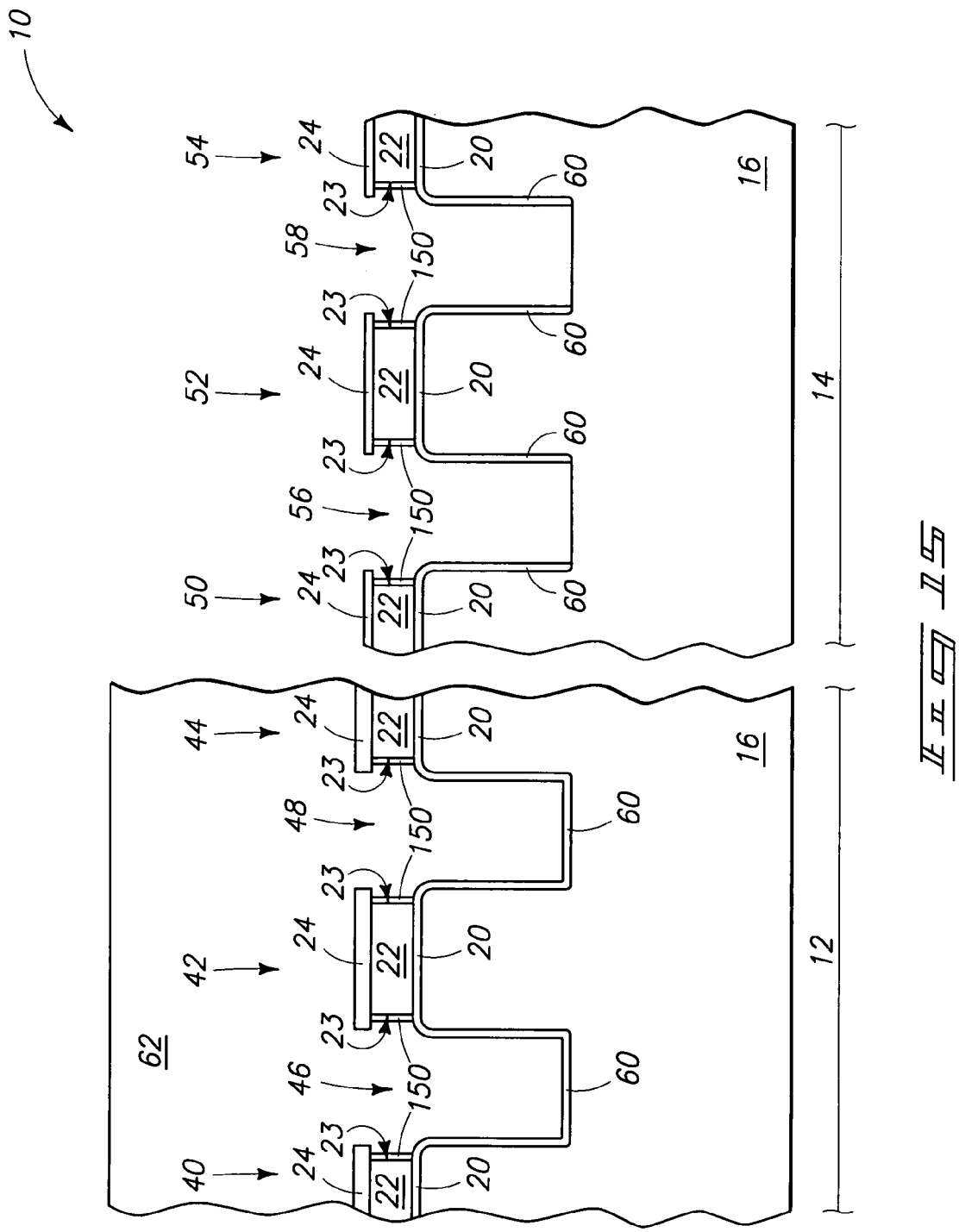
FIG. 15 is a view of the FIG. 1 fragments shown at a processing stage subsequent to that of FIG. 14.

Referring to FIG. 15, protective material 62 is formed over memory array region 12. After formation of protective material 62, oxide 60 is removed from the bottoms of trenches 56 and 58 with processing that can be identical to that discussed above with reference to FIG. 8.

Figure 16:
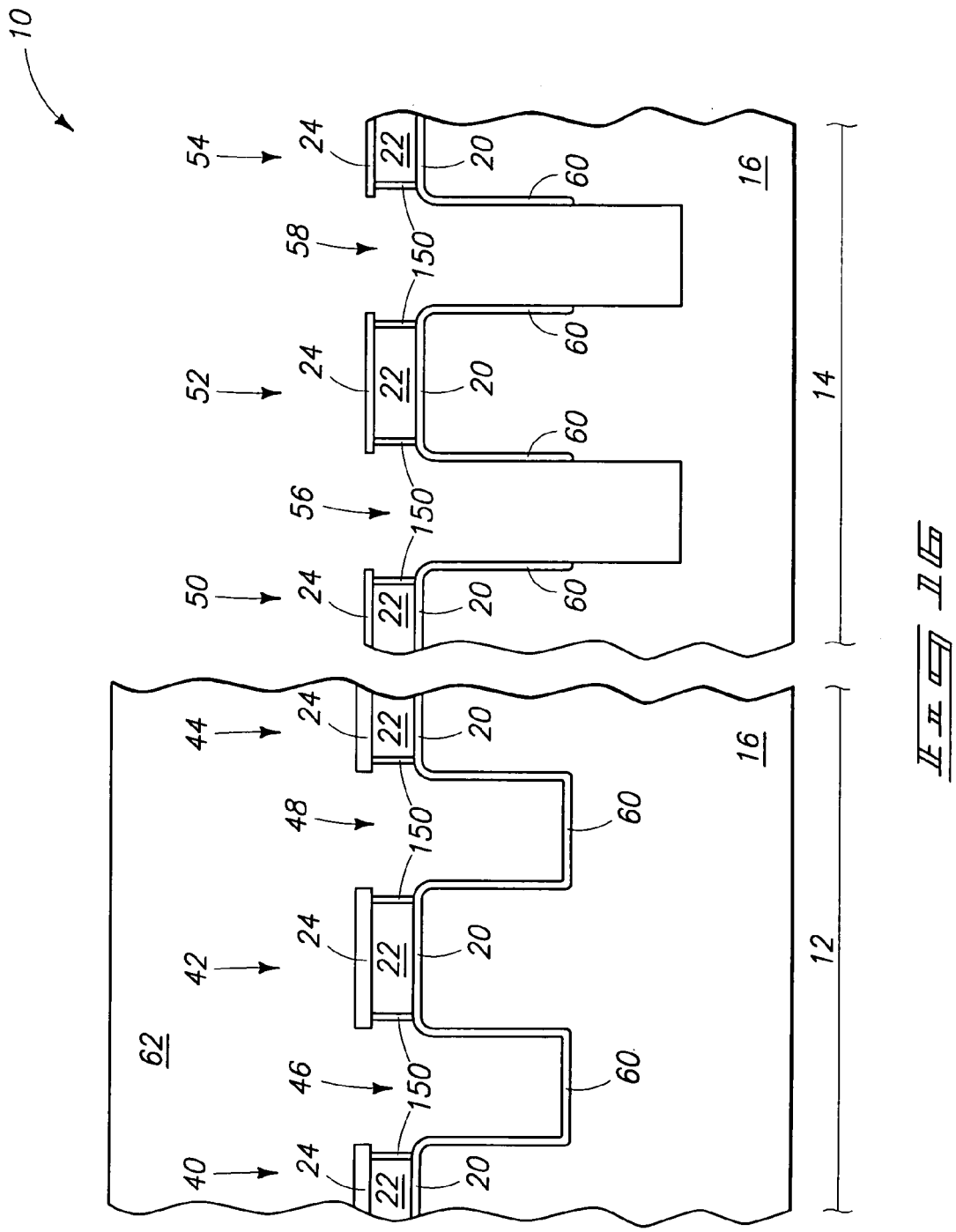
FIG. 16 is a view of the FIG. 1 fragments shown at a processing stage subsequent to that of FIG. 15.

Referring to FIG. 16, trenches 56 and 58 are extended downwardly into substrate 16 with processing that can be identical to that discussed above with reference to FIG. 7.

Figure 17:
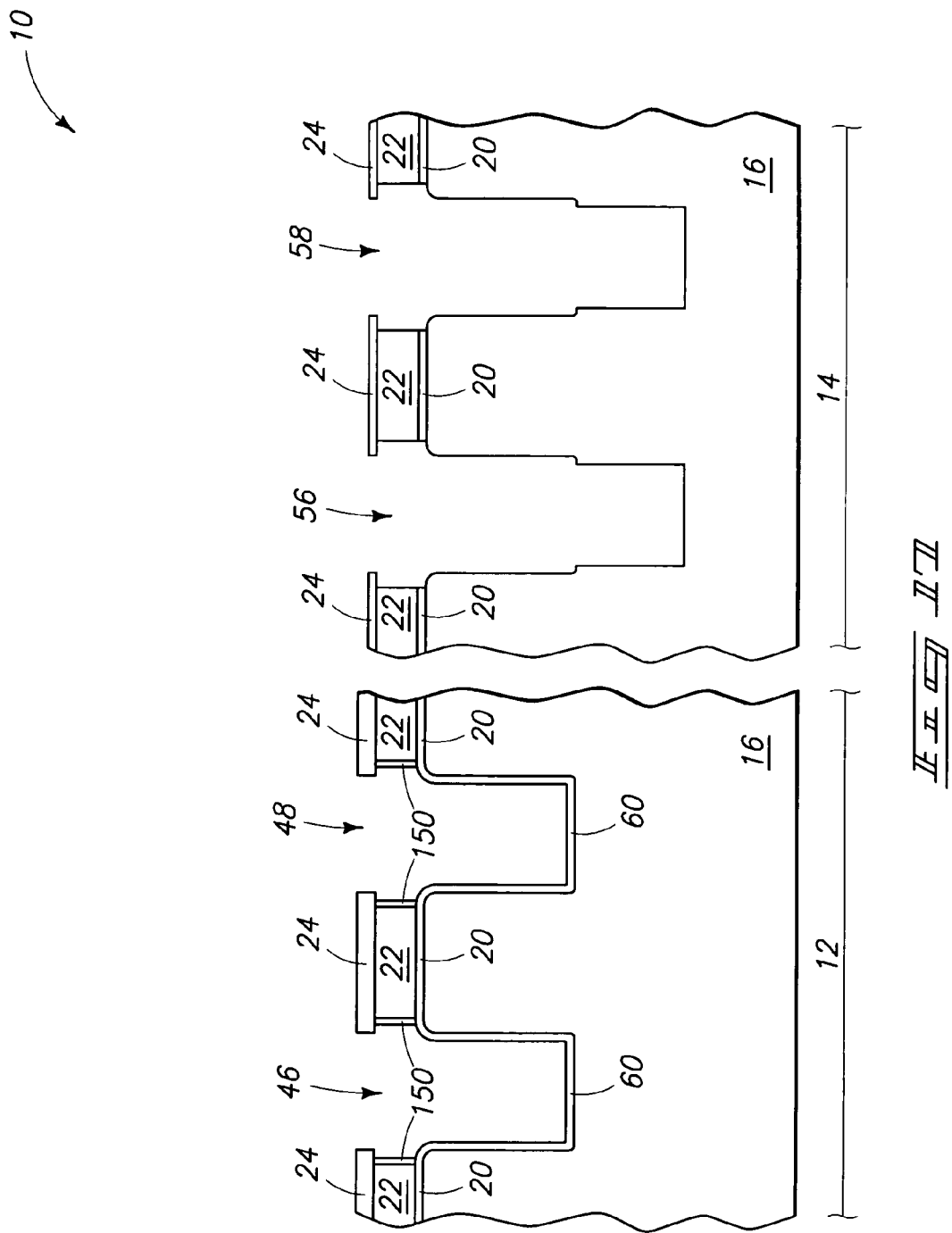
FIG. 17 is a view of the FIG. 1 fragments shown at a processing stage subsequent to that of FIG. 16.

Referring to FIG. 17, oxides 60 and 150 are removed from over peripheral region 14, and subsequently protective material 62 is removed from over memory array region 12. Oxides 60 and 150 can be removed from over peripheral region 14 with any suitable etch, including, for example, an etch utilizing hydrofluoric acid. The construction of FIG. 17 is similar to that of FIG. 8, except that protective material 62 has been removed at the processing stage of FIG. 17 and remains over memory array region 12 at the processing stage of FIG. 8.

Figure 18:
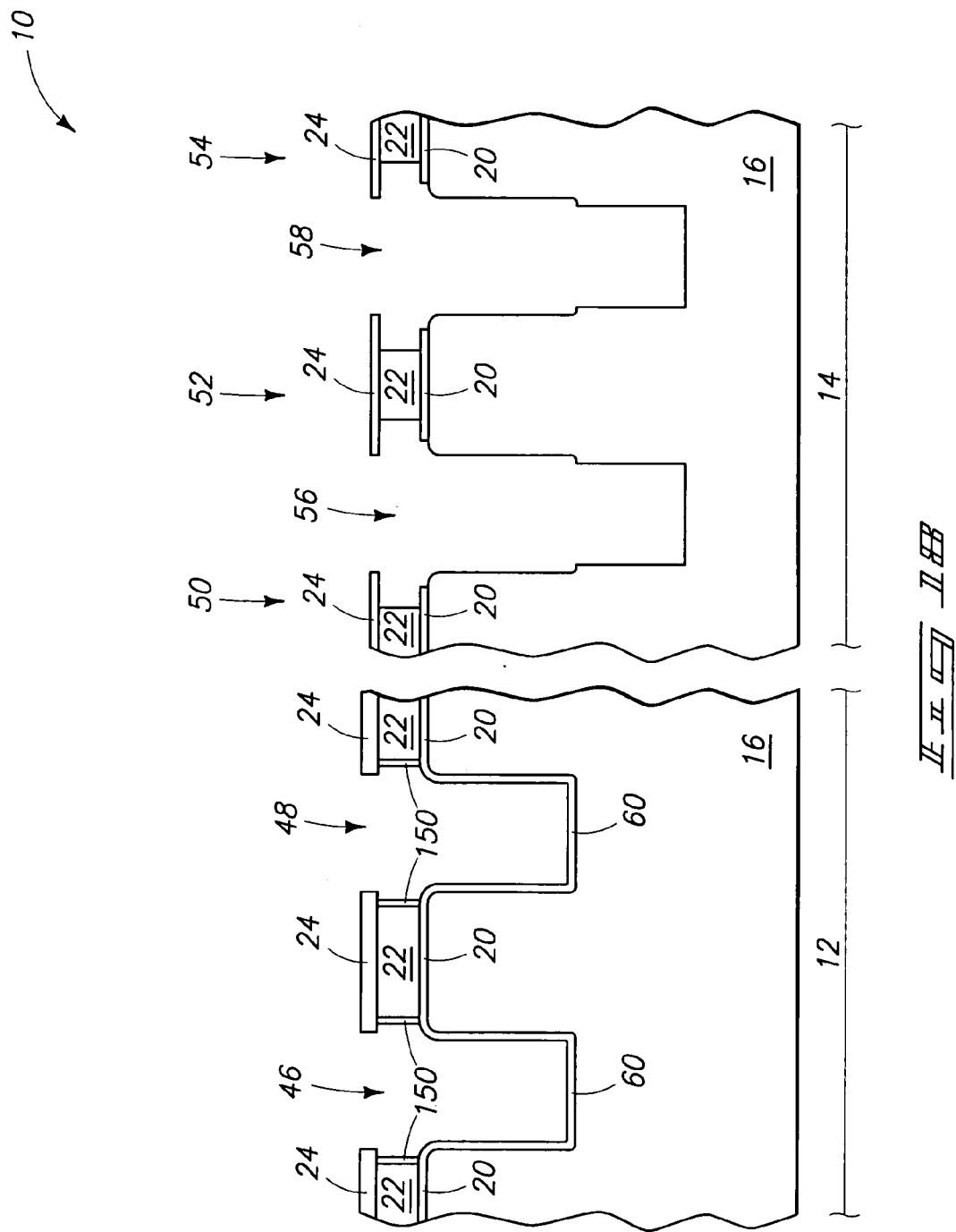
FIG. 18 is a view of the FIG. 1 fragments shown at a processing stage subsequent to that of FIG. 17.

Referring to FIG. 18, construction 10 is exposed to a nitride etch which laterally recesses sidewall edges of the nitride-containing material 22 associated with peripheral region 14. The oxide 150 protects sidewall edges of nitride-containing material 22 associated with memory array region 12 during the lateral recessing of the material associated with peripheral region 14. The lateral recessing of FIG. 18 can be conducted with processing identical to that discussed above with reference to FIG. 8.

Protective material 62 (FIG. 16) is removed prior to the processing of FIG. 18, since oxide 150 can protect sidewall edges of nitride-containing material 22 associated with memory array region 12 during the nitride etching of materials associated with peripheral region 14. It is to be understood, however, that protective material 62 could also be left in place throughout the processing stages of FIGS. 17 and 18 so that the lateral recessing of FIG. 18 occurs with material 62 remaining over memory array region 12.

Figure 19:
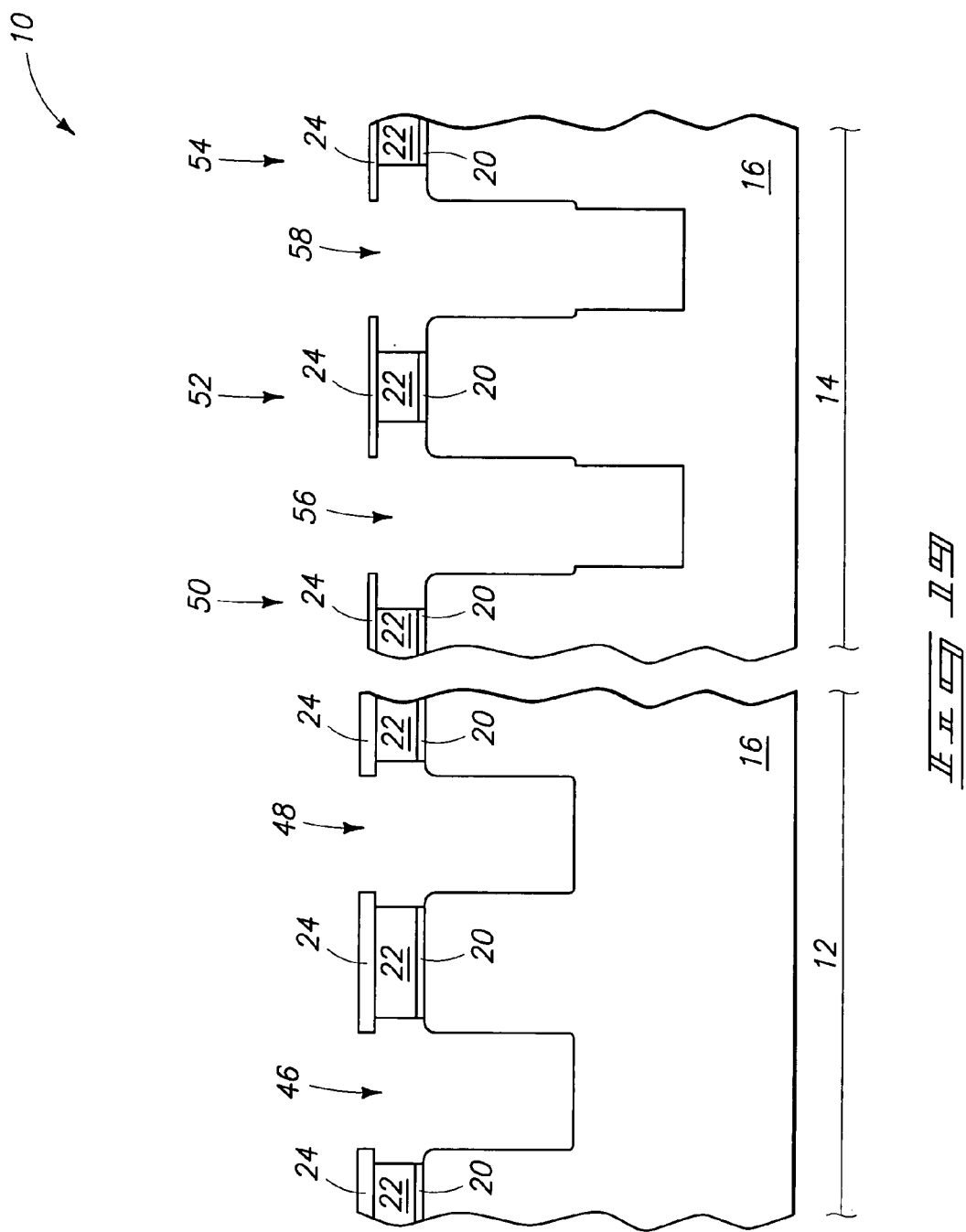
FIG. 19 is a view of the FIG. 1 fragments shown at a processing stage subsequent to that of FIG. 18.

Referring next to FIG. 19, exposed oxides 150, 20 and 60 are removed to leave a construction identical to the construction discussed above with reference to FIG. 9. Removal of exposed oxides 20, 60 and 150 can be accomplished with any suitable oxide etch, including, for example, an etch utilizing hydrofluoric acid.

The construction of FIG. 19 can subsequently be treated in accordance with the aspects discussed previously with reference to FIGS. 10–13 to form circuit devices associated with memory array region 12 and peripheral region 14.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor processing method comprising:
   providing a semiconductor substrate comprising a memory array region and a peripheral region proximate the memory array region;
   forming spaced nitride-containing masking structures over the substrate, some of the nitride-containing masking structures being first nitride-containing masking structures over the memory array region and others of the nitride-containing masking structures being second nitride-containing masking structures over the peripheral region;
   forming trenches in the substrate between the spaced nitride-containing masking structures, some of the trenches being first trenches associated with the memory array region and others being second trenches associated with the peripheral region, the second trenches being formed to be substantially deeper than the first trenches;
   after forming the first and second trenches, laterally recessing the second nitride-containing masking structures to a degree greater than any lateral recessing of the first nitride-containing masking structures; and
   after the lateral recessing of the second nitride-containing masking structures, oxidizing the substrate within the first and second trenches, and then depositing insulative material within the first and second trenches; and
   wherein the lateral recessing of the second nitride-containing structures is a second lateral recessing; wherein the oxidizing of the substrate within the first and second trenches is a second oxidizing; and further comprising:
      initially forming the first and second trenches to be about the same depth as one another;
      after the initial formation of the first and second trenches, first laterally recessing the first and second nitride-containing masking structures;
      after the first lateral recessing of the first and second nitride-containing masking structures; first oxidizing the substrate to form a first oxide layer extending within the first and second trenches;
      forming protective material within the first trenches and over the first oxide layer within the first trenches; and
      while the protective material is within the first trenches, removing at least some of the first oxide layer from within the second trenches and then extending the second trenches to be substantially deeper than the first trenches.

2. The method of claim 1 wherein:
   the nitride-containing masking structures have exposed nitride-containing lateral surfaces during the first oxidizing of the substrate to form the first oxide layer extending within the first and second trenches; and
   the first oxidation comprises dry thermal oxidation and does not appreciably oxidize the exposed nitride-containing lateral surfaces.

3. The method of claim 2 wherein:
   the protective material within the first trenches extends to over the first nitride-containing masking structures and covers the nitride-containing lateral surfaces of the first nitride-containing masking structures; and
   the protective material remains within the first trenches and over the nitride-containing lateral surfaces of the first nitride-containing masking structures during the second lateral recessing.

4. The method of claim 1 wherein:
   the nitride-containing masking structures have exposed nitride-containing lateral surfaces during the first oxidizing of the substrate to form the first oxide layer extending within the first and second trenches; and
   the first oxidation comprises wet thermal oxidation and forms some of the oxide from the exposed nitride-containing lateral surfaces.

5. The method of claim 4 wherein the protective material within the first trenches is removed prior to the second lateral recessing.

6. The method of claim 4 wherein the protective material within the first trenches is removed after the second lateral recessing.

7. A semiconductor processing method, comprising:
   providing a semiconductor substrate comprising a memory array region and a peripheral region proximate the memory array region;
   forming spaced masking stacks over the memory array region and the peripheral region, the masking stacks comprising a nitride-containing layer and an oxide-containing layer over the nitride-containing layer;
   forming trenches extending into the substrate between the spaced masking stacks, some of the trenches being first trenches associated with the memory array region and others being second trenches associated with the peripheral region;
   extending the second trenches deeper into the substrate while protecting the first trenches with a protective material provided within the first trenches;
   after extending the second trenches, laterally recessing the nitride-containing layer of the masking stacks over the peripheral region;
   removing the protective material from within the first trenches;
   after laterally recessing the nitride-containing layer, oxidizing the substrate within the first and second trenches, and then filling the first and second trenches with insulative material; and
   wherein the protective material is removed prior to the lateral recessing of the nitride-containing layer of the masking stacks over the peripheral region.

8. A semiconductor processing method, comprising:
   providing a semiconductor substrate comprising a memory array region and a peripheral region proximate the memory array region;
   forming spaced masking stacks over the memory array region and the peripheral region, the masking stacks comprising a nitride-containing layer and an oxide-containing layer over the nitride-containing layer;
   forming trenches extending into the substrate between the spaced masking stacks, some of the trenches being first trenches associated with the memory array region and others being second trenches associated with the peripheral region;
   extending the second trenches deeper into the substrate while protecting the first trenches with a protective material provided within the first trenches;

after extending the second trenches, laterally recessing the nitride-containing layer of the masking stacks over the peripheral region;

removing the protective material from within the first trenches;

after laterally recessing the nitride-containing layer, oxidizing the substrate within the first and second trenches, and then filling the first and second trenches with insulative material; and wherein the lateral recessing of the nitride-containing layer is a second lateral recessing; wherein the oxidizing of the substrate within the first and second trenches is a second oxidizing; and further comprising:

after forming the first and second trenches and prior to providing the protective material within the first trenches, first laterally recessing the nitride-containing layer;

after the first lateral recessing of the nitride-containing layer; first oxidizing the substrate to form a first oxide layer extending within the first and second trenches;

forming the protective material within the first trenches to be over the first oxide layer within the first trenches; and while the protective material is within the first trenches, removing at least some of the first oxide layer from within the second trenches and then performing the extending of the second trenches to be deeper into the substrate.

9. The method of claim 8 wherein:

the nitride-containing layer of the masking stacks has exposed nitride-containing lateral surfaces during the first oxidizing of the substrate to form the first oxide layer extending within the first and second trenches; and the first oxidation comprises dry thermal oxidation and does not appreciably oxidize the exposed nitride-containing lateral surfaces.

10. The method of claim 9 wherein:

the protective material within the first trenches extends to over the nitride-containing layer of the masking stacks of the memory array region and covers the nitride-containing lateral surfaces of the nitride-containing layer of the masking stacks of the memory array region; and the protective material remains within the first trenches and over the nitride-containing lateral surfaces of the nitride-containing layer of the masking stacks of the memory array region during the second lateral recessing.

11. The method of claim 8 wherein:

the nitride-containing layer of the masking stacks has exposed nitride-containing lateral surfaces during the first oxidizing of the substrate to form the first oxide layer extending within the first and second trenches; and the first oxidation comprises wet thermal oxidation and forms some of the oxide from the exposed nitride-containing lateral surfaces.

12. The method of claim 11 wherein the protective material within the first trenches is removed prior to the second lateral recessing.

13. The method of claim 11 wherein the protective material within the first trenches is removed after the second lateral recessing.

14. A semiconductor processing method, comprising:

providing a semiconductor substrate comprising a memory array region and a peripheral region proximate the memory array region;

forming a stack over the peripheral and memory array regions of the substrate; the stack comprising, in ascending order, a nitride-containing layer, oxide-containing layer, carbon-containing layer, and anti-reflective coating;

forming a patterned photoresist mask over the stack;

transferring a pattern from the photoresist mask to the oxide-containing layer and the nitride-containing layer to form spaced masking stacks comprising the patterned nitride-containing layer and patterned oxide-containing layer;

removing the carbon-containing layer, anti-reflective coating and patterned photoresist mask;

forming trenches extending into the substrate between the spaced masking stacks, some of the trenches being first trenches associated with the memory array region and others being second trenches associated with the peripheral region;

forming a protective material over the memory array region;

while the protective material is over the memory array region, extending the second trenches deeper into the substrate;

removing the protective material;

after extending the second trenches, laterally recessing the nitride-containing layer of the masking stacks over the peripheral region; and after laterally recessing the nitride-containing layer and removing the protective material, oxidizing the substrate within the first and second trenches, and then filling the first and second trenches with insulative material.

15. The method of claim 14 wherein the protective material is removed prior to the lateral recessing of the nitride-containing layer.

16. The method of claim 14 wherein the protective material is removed after the lateral recessing of the nitride-containing layer.

17. The method of claim 14 wherein the lateral recessing of the nitride-containing layer is a second lateral recessing; wherein the oxidizing of the substrate within the first and second trenches is a second oxidizing; and further comprising:

after forming the first and second trenches and forming the protective material, first laterally recessing the nitride-containing layer;

after the first lateral recessing of the nitride-containing layer; first oxidizing the substrate to form a first oxide layer extending within the first and second trenches;

forming the protective material to be within the first trenches and to be over the first oxide layer within the first trenches; and while the protective material is within the first trenches, removing at least some of the first oxide layer from within the second trenches and then performing the extending of the second trenches to be deeper into the substrate.

18. The method of claim 17 wherein:

the nitride-containing layer of the masking stacks has exposed nitride-containing lateral surfaces during the first oxidizing of the substrate to form the first oxide layer extending within the first and second trenches; and the first oxidation comprises dry thermal oxidation and does not appreciably oxidize the exposed nitride-containing lateral surfaces.

19. The method of claim 18 wherein:
the protective material within the first trenches extends to over the nitride-containing layer of the masking stacks of the memory array region and covers the nitride-containing lateral surfaces of the nitride-containing layer of the masking stacks of the memory array region; and
the protective material remains within the first trenches and over the nitride-containing lateral surfaces of the nitride-containing layer of the masking stacks of the memory array region during the second lateral recessing.

20. The method of claim 17 wherein:
the nitride-containing layer of the masking stacks has exposed nitride-containing lateral surfaces during the first oxidizing of the substrate to form the first oxide layer extending within the first and second trenches; and
the first oxidation comprises wet thermal oxidation and forms some of the oxide from the exposed nitride-containing lateral surfaces.

21. The method of claim 20 wherein the protective material within the first trenches is removed prior to the second lateral recessing.

22. The method of claim 20 wherein the protective material within the first trenches is removed after the second lateral recessing.

23. The method of claim 14 wherein the second trenches are spaced from one another by mesas of semiconductor material of the substrate having the masking stacks thereover; wherein the oxidizing of the substrate within the second trenches forms rounded upper corners of the mesas; and further comprising:
after the oxidizing, removing the masking stacks from over the mesas;
forming dielectric material over the mesas; and
forming electrically conductive material over the dielectric material.

24. The method of claim 23 wherein the dielectric material and electrically conductive material are together incorporated into a plurality of spaced lines.

25. The method of claim 23 wherein the mesas are second mesas; wherein the first trenches are spaced from one another by first mesas of the semiconductor material having some of the masking stacks thereover; wherein the masking stacks are removed from over the first mesas simultaneously with the removal of the masking stacks from over the second mesas; and further comprising forming a plurality of wordlines extending across the first mesas.

* * * * *